US009099683B2

(12) United States Patent
Omoto

(10) Patent No.: US 9,099,683 B2
(45) Date of Patent: Aug. 4, 2015

(54) ORGANIC ELECTROLUMINESCENCE DISPLAY AND ELECTRONIC EQUIPMENT

(75) Inventor: Keisuke Omoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 236 days.

(21) Appl. No.: 13/348,662

(22) Filed: Jan. 12, 2012

(65) Prior Publication Data

US 2012/0200555 A1    Aug. 9, 2012

(30) Foreign Application Priority Data

Feb. 4, 2011    (JP) ................. 2011-022351

(51) Int. Cl.
*H01L 51/52*    (2006.01)
*H01L 27/32*    (2006.01)
*H01L 51/50*    (2006.01)

(52) U.S. Cl.
CPC .......... *H01L 51/5281* (2013.01); *H01L 27/322* (2013.01); *H01L 27/326* (2013.01); *H01L 27/3276* (2013.01); *H01L 51/5044* (2013.01)

(58) Field of Classification Search
CPC . H01L 27/322; H01L 27/326; H01L 27/3276; H01L 51/5281; H01L 51/5044; G06F 3/038; H05B 33/14
See application file for complete search history.

(56) References Cited

U.S. PATENT DOCUMENTS

| 2007/0087492 A1* | 4/2007 | Yamanaka ................... 438/166 |
| 2008/0218065 A1* | 9/2008 | Ishihara et al. .............. 313/504 |
| 2008/0224968 A1* | 9/2008 | Kashiwabara ................. 345/83 |
| 2010/0149462 A1* | 6/2010 | Nishino et al. ............... 349/102 |
| 2010/0309178 A1* | 12/2010 | Tomida et al. ............... 345/205 |
| 2010/0321283 A1* | 12/2010 | Mizuno et al. ................ 345/88 |
| 2011/0072409 A1* | 3/2011 | Gambino et al. ............ 716/136 |
| 2011/0140107 A1* | 6/2011 | Kang et al. .................. 257/57 |
| 2011/0210355 A1* | 9/2011 | Yamazaki et al. ............ 257/98 |
| 2012/0200555 A1* | 8/2012 | Omoto .......................... 345/212 |
| 2012/0313913 A1* | 12/2012 | Shiraki et al. ................ 345/207 |

FOREIGN PATENT DOCUMENTS

JP    2003-123971    4/2003

OTHER PUBLICATIONS

WO 2011/104957 A1 by Shiraki.*

* cited by examiner

*Primary Examiner* — Aneeta Yodichkas
(74) *Attorney, Agent, or Firm* — Fishman Stewart Yamaguchi PLLC

(57) ABSTRACT

An organic electroluminescence display has a bottom emission structure in which a white organic electroluminescence element adapted to emit white light is formed, pixel by pixel, on a substrate, and in which light emitted by the white organic electroluminescence element is extracted from a rear side of the substrate. The organic electroluminescence display includes: a color filter used in combination with the white organic electroluminescence element to extract light of different colors; and metal interconnects formed, pixel by pixel, in such a manner as to surround a light-emitting section of the white organic electroluminescence element and the color filter.

23 Claims, 25 Drawing Sheets

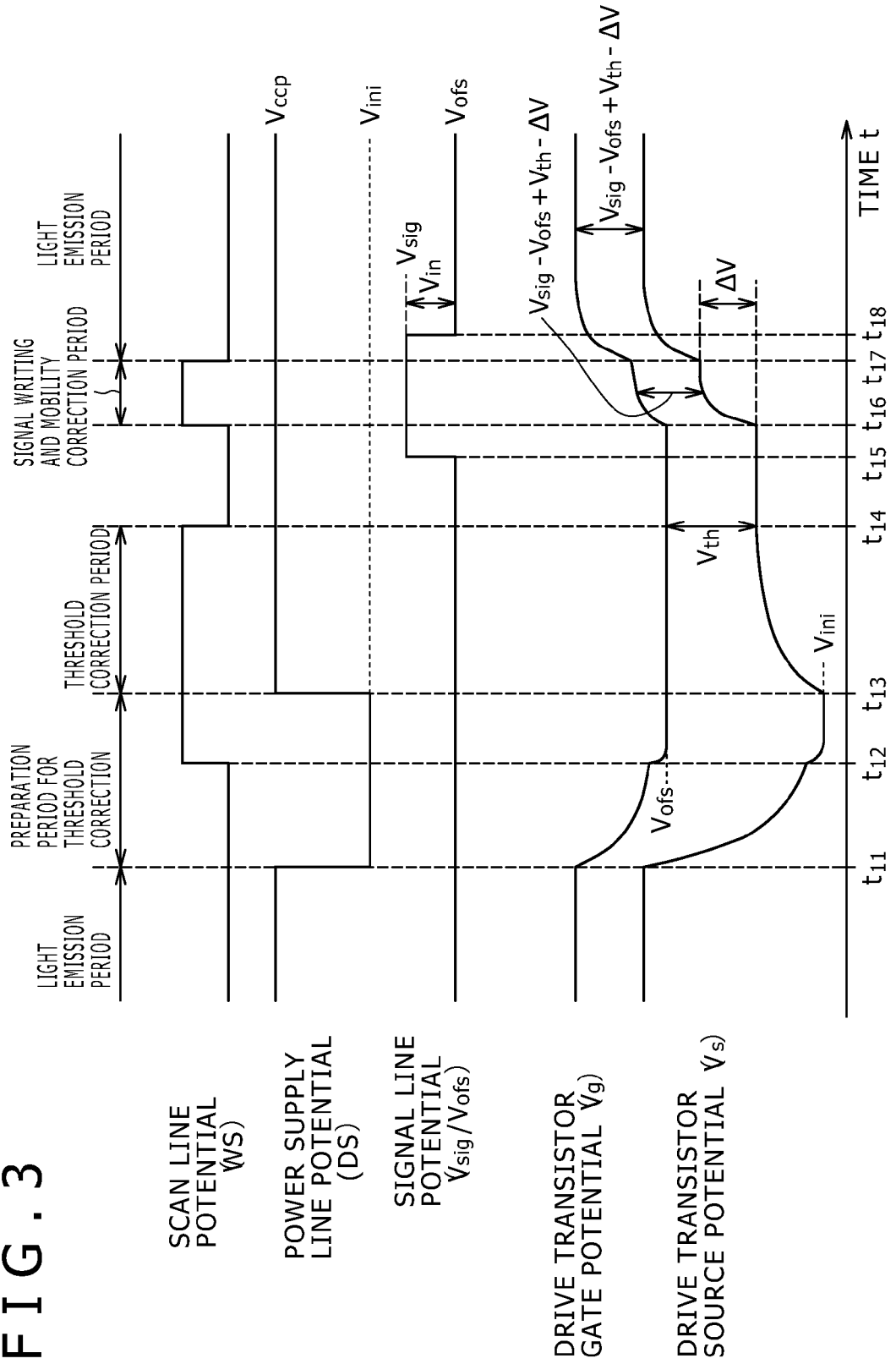

BEFORE t=t₁₁ t=t₁₁ t=t₁₂ t=t₁₃

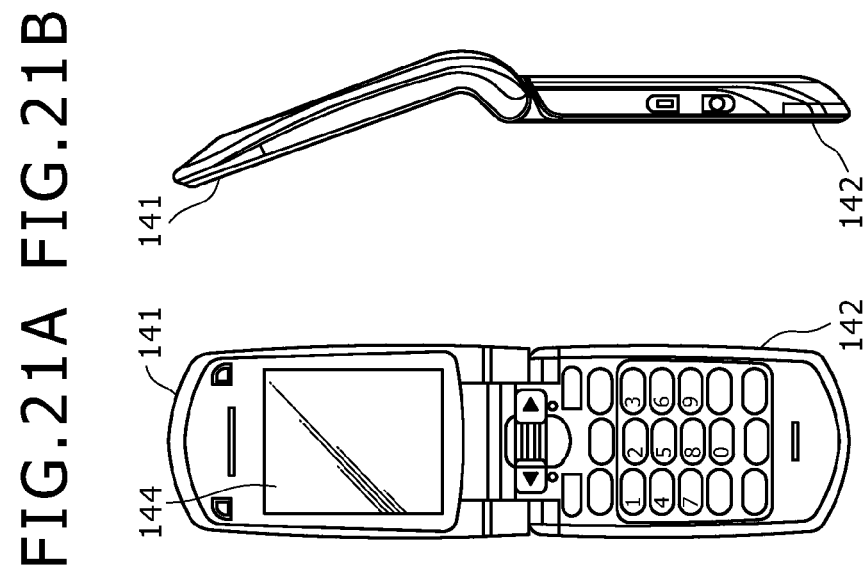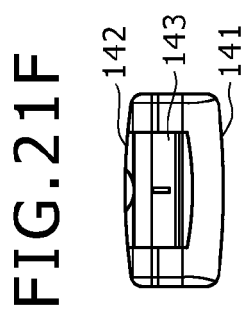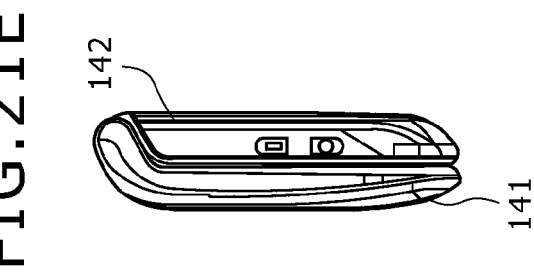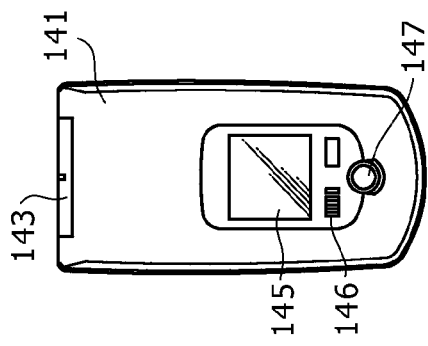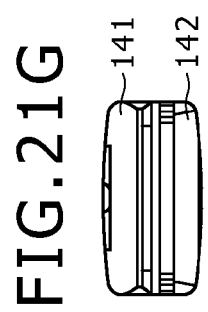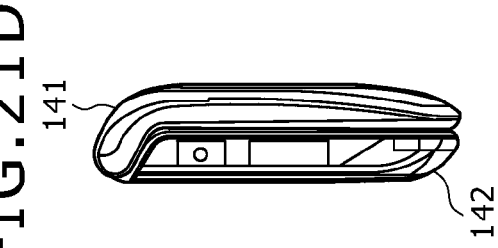

ORGANIC ELECTROLUMINESCENCE DISPLAY AND ELECTRONIC EQUIPMENT

BACKGROUND

The present disclosure relates to an organic EL display and electronic equipment.

Among flat panel displays, some use a so-called current-driven electro-optical element, whose emission brightness changes according to the current flowing through the device, as a light-emitting section (light-emitting element) of each of the pixels. Organic EL elements that are based on electroluminescence (EL) of an organic material and emit light when an electric field is applied to the organic thin film are known as current-driven electro-optical elements.

An organic EL display using an organic EL element as a light-emitting section of each of the pixels offers the following features. That is, the organic EL element can be driven by application of a voltage of 10V or less, making the organic EL display low in power consumption. The organic EL element is self-luminous, thus allowing for the organic EL display to provide higher image visibility than liquid crystal displays. Moreover, it is not necessary for the organic EL display to have any lighting members such as backlight, thus making the weight and thickness reduction easy. Further, the organic EL element has an extremely high response speed of the order of several microseconds, thus making the organic EL display free from afterimage during display of a moving image.

Incidentally, organic EL displays based on a so-called side-by-side patterning of RGB subpixels using a mask are generally known. In this process, R(red), G(green) and B(blue) organic EL materials are patterned by vapor deposition using a mask. In an organic EL display based on this scheme, RGB organic EL elements 21R, 21G and 21B and a color filter 80 are used in combination as illustrated in FIG. 22. Using the color filter 80 in combination provides higher color purity. In order to achieve a high definition organic EL display with the side-by-side patterning of RGB subpixels using a mask, however, the patterning of pixels of different colors is extremely difficult.

In contrast, some organic EL displays are not based on side-by-side patterning of RGB subpixels using a mask. Instead, these displays extract RGB light by using an organic EL element adapted to emit white light (hereinafter referred to as the "white organic EL element") 21W and the color filter 80 in combination as illustrated in FIG. 23 (refer, for example, to Japanese Patent Laid-open No. 2003-123971). This scheme using the white organic EL element 21W in combination with the color filter 80 is advantageous in increasing the size of the organic EL display and achieving higher definition.

SUMMARY

However, when the white organic EL element 21W and color filter 80 are used in combination, it is necessary to provide a light-shielding layer between every two RGB filters so as to extract each of RGB light beams using the color filter 80 from the white light emitted from the white organic EL element 21W. If no light-shielding layers are provided, white light leaks between every two RGB filters as shown in FIG. 24, thus resulting in poorer color reproducibility caused by light leak.

On the other hand, when a color filter is formed, a taper level difference is formed on the periphery of the color filter, thus making the periphery thinner than the center. That is, there is a difference in thickness in the periphery of the color filter. Then, this difference in thickness leads to color shift, thus making it difficult to provide a desired emission color. Because of these reasons, it is necessary to provide a light-shielding layer between every two RGB filters if the white organic EL element 21W and color filter 80 are used in combination. As a result, a step of forming light-shielding layers is necessary, thus resulting in more process steps.

In light of the foregoing, it is desirable to provide an organic EL display and electronic equipment having the same that can keep white light leak to a minimum without increasing the number of process steps in using white organic EL elements and color filter in combination.

According to an embodiment of the present disclosure, there is provided an organic EL display having a bottom emission structure in which a white organic EL element adapted to emit white light is formed, pixel by pixel, on a substrate, and in which light emitted by the white organic EL element is extracted from a rear side of the substrate. The white organic EL element is used in combination with a color filter to extract light of different colors. Metal interconnects are formed, pixel by pixel, in such a manner as to surround a light-emitting section of the white organic EL element and the color filter.

According to another embodiment of the present disclosure, there is provided electronic equipment having an organic electroluminescence display. The organic electroluminescence display has a bottom emission structure in which a white organic electroluminescence element adapted to emit white light is formed, pixel by pixel, on a substrate, and in which light emitted by the white organic electroluminescence element is extracted from a rear side of the substrate. The organic electroluminescence display includes a color filter used in combination with the white organic electroluminescence element to extract light of different colors, and metal interconnects formed, pixel by pixel, in such a manner as to surround a light-emitting section of the white organic electroluminescence element and the color filter.

In the organic EL display configured as described above, it is possible to prevent white light leak between every two filters without forming a light-shielding layer between every two color filters by surrounding the light-emitting section of the white organic EL element and the color filter with metal interconnects. This keeps the aggravation of color reproducibility caused by white light leaks and color shift to a minimum.

The present disclosure prevents white light leak without forming light-shielding layers when a white organic EL element and a color filter are used in combination. This provides an organic EL display free from aggravation of color reproducibility or color shift without increasing the number of process steps.

BRIEF DESCRIPTION OF THE DRAWINGS

FIG. 3 is a timing waveform diagram used to describe the basic circuit operation of the organic EL display to which the present disclosure is applied;

FIG. 10 is a schematic plan view illustrating the pixel structure of the organic EL display having a color filter attached to substrates;

FIG. 18A is a perspective view as seen from the front, and FIG. 18B is a perspective view as seen from the back;

FIGS. 21A to 21G are appearance views illustrating a mobile phone to which the present disclosure is applied, and FIG. 21A is a front view in an open position, FIG. 21B is a side view thereof, FIG. 21C is a front view in a closed position, FIG. 21D is a left side view, FIG. 21E is a right side view, FIG. 21F is a top view, and FIG. 21G is a bottom view;

DETAILED DESCRIPTION OF THE PREFERRED EMBODIMENTS

A detailed description will be given below of the modes for carrying out the techniques of the present disclosure (hereinafter written as the "embodiments") with reference to the accompanying drawings. It should be noted that the description will be given in the following order.

1. Organic EL display to which the present disclosure is applied
   1-1. System configuration
   1-2. Basic circuit operation
2. First embodiment
3. Second embodiment
4. Application examples (electronic equipment)

1. Organic EL Display to Which the Present Disclosure is Applied

[1-1. System Configuration]

Figure 1:
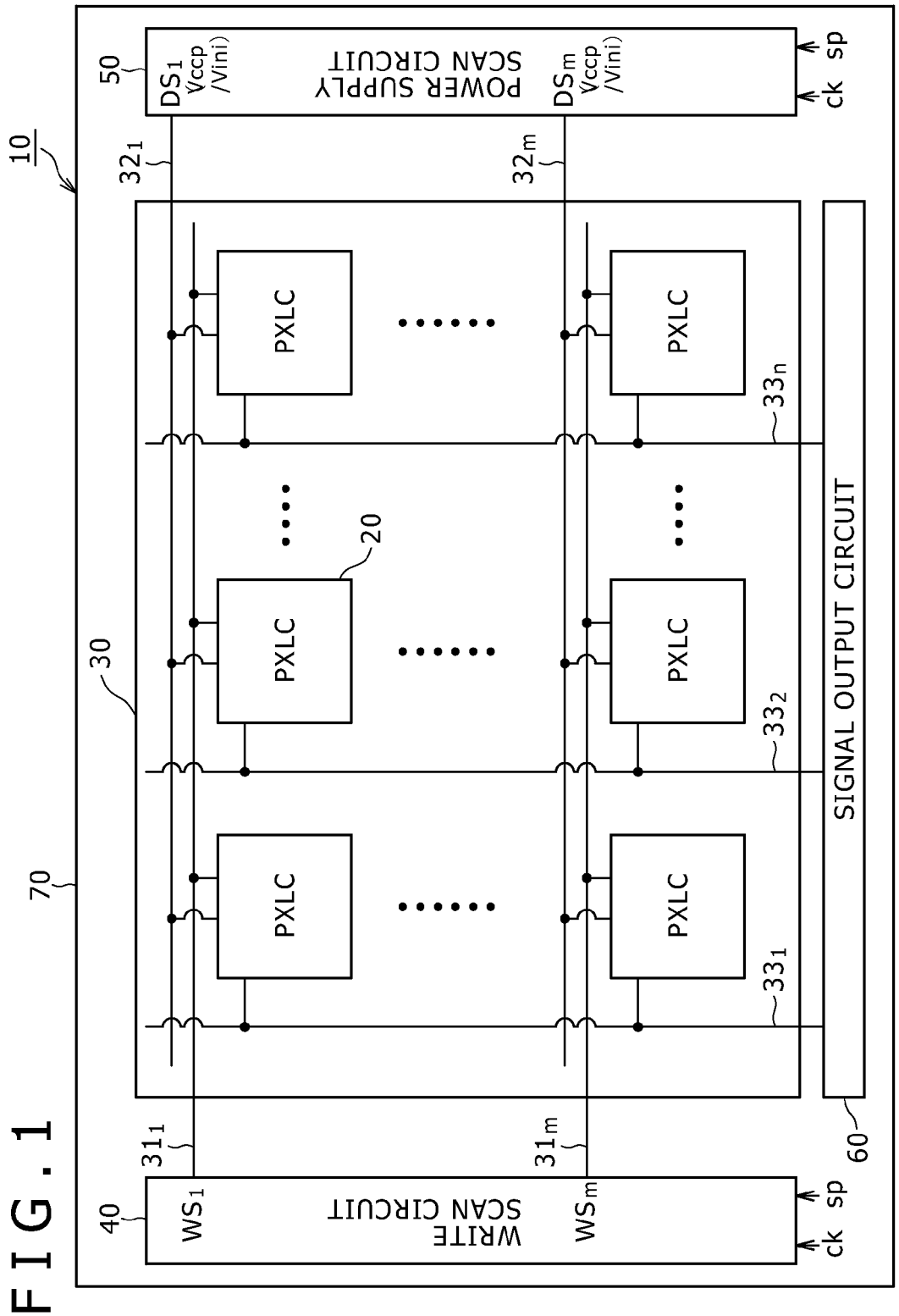
FIG. 1 is a system configuration diagram illustrating the outlined configuration of an active matrix organic EL display to which the present disclosure is applied.

FIG. 1 is a system configuration diagram illustrating the outlined configuration of an active matrix organic EL display to which the present disclosure is applied.

An active matrix organic EL display controls the current flowing through an organic EL element, i.e., a current-driven electro-optical element, using active elements such as insulating gate field-effect transistors provided in the same pixel as the organic EL element. TFTs (thin film transistors) are typically used as insulating gate field-effect transistors.

As illustrated in FIG. 1, an organic EL display 10 according to the present application example includes a plurality of pixels 20, each having an organic EL element, a pixel array section 30 and a drive circuit section provided around the pixel array section 30. The pixel array section 30 includes the pixels 20 arranged two-dimensionally in a matrix form. The drive circuit section includes a write scan circuit 40, power supply scan circuit 50, signal output circuit 60 and other sections and drives the pixels 20 of the pixel array section 30.

Here, if the organic EL display 10 is capable of color display, each pixel (unit pixel) making up the unit of color image formation includes a plurality of subpixels. Each of these subpixels corresponds to one of the pixels 20 shown in FIG. 1. More specifically, each of the pixels in a display capable of color display includes, for example, a subpixel adapted to emit red (R) light, another adapted to emit green (G) light and still another adapted to emit blue (B) light.

It should be noted, however, that the subpixels making up each of the pixels are not limited to a combination of subpixels of RGB or three primary colors. Instead, each of the pixels may include one or a plurality of subpixels of colors in addition to the subpixels of three primary colors. More specifically, each of the pixels may additionally include, for example, a subpixel adapted to emit white (W) light for improving luminance. Alternatively, each of the pixels may additionally include a subpixel adapted to emit light of a complementary color for a wider range of color reproduction.

The pixel array section 30 has scan lines $31_1$ to $31_m$ and power supply lines $32_1$ to $32_m$ disposed in the row direction (direction along the pixel rows) of the pixels 20 arranged in m rows by n columns. The scan lines $31_1$ to $31_m$ and power supply lines $32_1$ to $32_m$ are each disposed for one of the pixel rows. Further, the pixel array section 30 has signal lines $33_1$ to $33_n$ disposed in the column direction (direction along the pixel columns) of the pixels 20 arranged in m rows by n columns. The signal lines $33_1$ to $33_n$ are each disposed for one of the pixel columns.

The scan lines $31_1$ to $31_m$ are each connected to the output end of the associated row of the write scan circuit 40. The power supply lines $32_1$ to $32_m$ are each connected to the output end of the associated row of the power supply scan circuit 50. The signal lines $33_1$ to $33_n$ are each connected to the output end of the associated column of the signal output circuit 60.

The pixel array section 30 is normally formed on a transparent insulating substrate made, for example, of a glass substrate. As a result, the organic EL display 10 has a flat panel structure. The drive circuit of each of the pixels 20 of the pixel array section 30 can be formed by using amorphous silicon TFTs or low-temperature polysilicon TFTs. When low-temperature polysilicon TFTs are used, the write scan circuit 40, power supply scan circuit 50 and signal output circuit 60 can be formed on a display panel (substrate) 70 on which the pixel array section 30 is formed as illustrated in FIG. 1.

The write scan circuit 40 includes, for example, a shift register circuit adapted to sequentially shift (transfer) a start pulse sp in synchronism with a clock pulse ck. When writing a video signal voltage to the pixels 20 of the pixel array section 30, the same circuit 40 sequentially supplies write scan signals WS ($WS_1$ to $WS_m$) respectively to the scan lines $31_1$ to $31_m$, thus scanning (progressively scanning) the pixels 20 of the pixel array section 30 in sequence on a row-by-row basis.

The power supply scan circuit 50 includes, for example, a shift register circuit adapted to sequentially shift the start pulse sp in synchronism with the clock pulse ck. The same circuit 50 supplies power supply potentials DS ($DS_1$ to $DS_m$) to the power supply lines $32_1$ to $32_m$ in synchronism with the progressive scan performed by the write scan circuit 40. Each of the power supply potentials DS can be switched between two power supply potentials, i.e., a first power supply potential $V_{ccp}$ and a second power supply potential $V_{ini}$ lower than the first power supply potential $V_{ccp}$. As will be described later, the pixels 20 are controlled to emit light or stop emission by switching the power supply potentials DS between $V_{ccp}$ and $V_{ini}$.

The signal output circuit 60 selectively outputs a video signal voltage (hereinafter may be simply written as the "signal voltage") $V_{sig}$ commensurate with brightness information supplied from the signal source (not shown) or a reference voltage $V_{ofs}$. Here, the reference voltage $V_{ofs}$ is a potential that serves as a reference (e.g., potential corresponding to the black level of the video signal) for the video signal voltage $V_{sig}$ and is used during threshold correction which will be described later.

The signal voltage $V_{sig}$ or reference voltage $V_{ofs}$ output from the signal output circuit 60 is written via the signal lines $33_1$ to $33_n$, on a pixel-row-by-pixel-row basis, to the pixels 20 of the pixel array section 30 in the pixel row selected as a result of scanning performed by the write scan circuit 40. That is, the signal output circuit 60 progressively writes the signal voltage $V_{sig}$ on a row-by-row (line-by-line) basis for driving purposes.

(Pixel Circuit)

Figure 2:
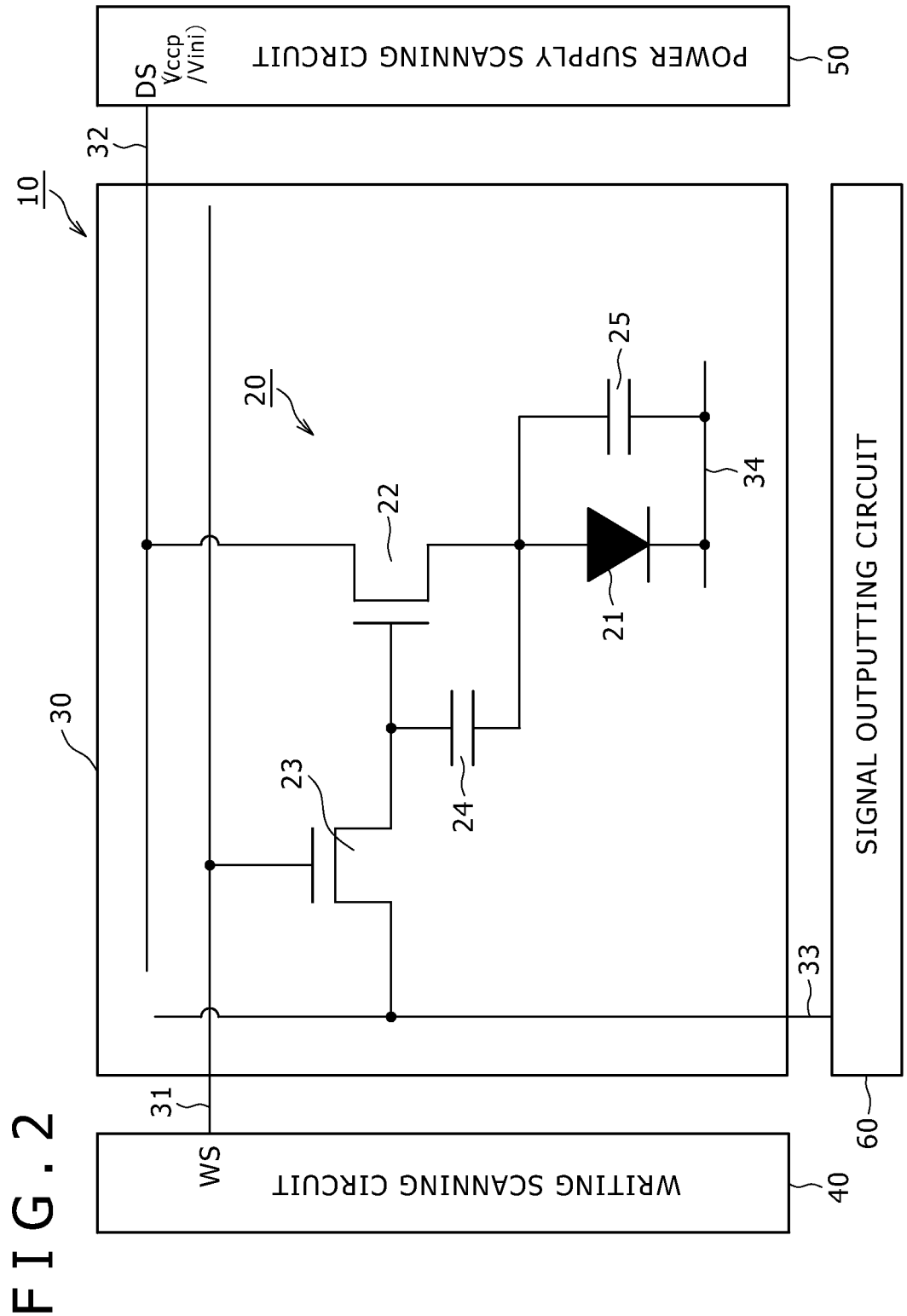
FIG. 2 is a circuit diagram illustrating a specific example of a circuit configuration of a pixel (pixel circuit)

FIG. 2 is a circuit diagram illustrating a specific example of a circuit configuration of the pixel (pixel circuit) 20. The light-emitting section of the pixel 20 includes an organic EL element 21, i.e., a current-driven electro-optical element whose emission brightness changes according to the current flowing through the device.

As illustrated in FIG. 2, the pixel 20 includes the organic EL element 21 and a drive circuit adapted to drive the organic EL element 21 by passing a current through the same element 21. The organic EL element 21 has its cathode electrode connected to a common power supply line 34 (so-called solid interconnect) that is disposed to be shared by all the pixels 20.

The drive circuit adapted to drive the organic EL element 21 includes a drive transistor 22, write transistor 23, holding capacitor 24 and auxiliary capacitor 25. N-channel TFTs can be used as the drive transistor 22 and write transistor 23. It should be noted, however, that the combination of conductivity types of the drive transistor 22 and write transistor 23 shown here is merely an example and is not limited thereto.

The drive transistor 22 has one of its electrodes (source or drain electrode) connected to the anode electrode of the organic EL element 21 and the other electrode connected (drain or source electrode) connected to one of the power supply lines 32 ($32_1$ to $32_m$).

The write transistor 23 has one of its electrodes (source or drain electrode) connected to one of the signal lines 33 ($33_1$ to $33_n$) and the other electrode to the gate electrode of the drive transistor 22. Further, the write transistor 23 has its gate electrode connected to one of the scan lines 31 ($31_1$ to $31_m$).

For the drive transistor 22 and write transistor 23, the term "one of its electrodes" refers to a metal interconnect electrically connected to the source or drain region, and the term "the other electrode" refers to a metal interconnect electrically connected to the drain or source region. On the other hand, one of its electrodes may serve as a source or drain electrode, and the other electrode as a drain or source electrode, depending on the relationship in potential between one of its electrodes and the other electrode.

The holding capacitor 24 has one of its electrodes connected to the gate electrode of the drive transistor 22, and the other electrode connected to the other electrode of the drive transistor 22 and the anode electrode of the organic EL element 21.

The auxiliary capacitor 25 has one of its electrodes connected to the anode electrode of the organic EL element 21, and the other electrode to the common power supply line 34. The auxiliary capacitor 25 is provided as necessary to complement the lack of capacitance of the organic EL element 21 and provide higher gain for writing a video signal to the holding capacitor 24. That is, the auxiliary capacitor 25 may not be necessary and may be omitted if the equivalent capacitance of the organic EL element 21 is sufficiently large.

Here, the other electrode of the auxiliary capacitor 25 is connected to the common power supply line 34. However, the node to which the other electrode thereof is connected is not limited to the common power supply line 34, and may be connected to any node so long as this node has a fixed potential. By connecting the other electrode of the auxiliary capacitor 25 to a fixed node potential, it is possible to serve the intended purposes, namely, to complement the lack of capacitance of the organic EL element 21 and provide higher gain for writing a video signal to the holding capacitor 24.

In the pixel 20 configured as described above, the write transistor 23 goes into conduction in response to an active high write scan signal WS applied from the write scan circuit 40 to the gate electrode of the write transistor 23 via the scan line 31. As a result, the write transistor 23 samples the video signal voltage $V_{sig}$ commensurate with brightness information or the reference voltage $V_{ofs}$ supplied from the signal output circuit 60 via the signal line 33, writing the sampled voltage to the pixel 20. The written video signal voltage $V_{sig}$ or reference voltage $V_{ofs}$ is applied to the gate electrode of the drive transistor 22 and held by the holding capacitor 24.

The drive transistor 22 operates in a saturation region with one of its electrode serving as a drain electrode and the other electrode as a source electrode when the power supply potential DS of the power supply line 32 (one of $32_1$ to $32_m$) is at the first power supply potential $V_{ccp}$. As a result, the drive transistor 22 is supplied with a current from the power supply line 32, thus current-driving the organic EL element 21 to emit light. More specifically, when the drive transistor 22 operates in the saturation region, a drive current commensurate with the level of the signal voltage $V_{sig}$ held by the holding capacitor 24 is supplied to the organic EL element 21, thus current-driving the same element 21 to emit light.

Further, when the power supply potential DS changes from the first power supply potential $V_{ccp}$ to the second power supply potential $V_{ini}$, the drive transistor 22 acts as a switching transistor with one of its electrode serving as a source electrode and the other as a drain electrode. As a result, the drive transistor 22 stops supplying a drive current to the organic EL element 21, thus causing the same element 21 to stop emitting light. That is, the drive transistor 22 also has the functionality to control the organic EL element 21 to emit light or stop light emission.

Thanks to the switching operation of the drive transistor 22, a period is provided during which the organic EL element 21 does not emit light (non-light emission period), thus making it possible to control the ratio (duty) between the light emission and non-light emission periods of the organic EL element 21. This duty control contributes to reduced afterimage blur resulting from the pixel emitting light over a span of one display frame period, thus providing better moving image quality.

Of the first and second power supply potentials $V_{ccp}$ and $V_{ini}$ selectively supplied from the power supply scan circuit 50 via the power supply line 32, the first power supply potential $V_{ccp}$ is used to supply a drive current which drives the organic EL element 21 to emit light to the drive transistor 22. In contrast, the second power supply potential $V_{ini}$ is used to reverse-bias the organic EL element 21. The second power supply potential $V_{ini}$ is set to a potential lower than the reference voltage $V_{ofs}$, for example, lower than $V_{ofs}$-$V_{th}$ where the threshold voltage of the drive transistor 22 is $V_{th}$, and preferably sufficiently lower than, $V_{ofs}$-$V_{th}$.

[1-2. Basic Circuit Operation]

A description will be given next of the basic circuit operation of the organic EL display 10 configured as described above based on the timing waveform diagram shown in FIG. 3 and with reference to the explanatory diagrams shown in FIGS. 4 and 5. It should be noted that the write transistor 23 is represented by a switch symbol in the explanatory diagrams shown in FIGS. 4 and 5 for simplification. Further, the equivalent capacitor 25 of the organic EL element 21 is also shown.

The timing waveform diagram shown in FIG. 3 illustrates the changes in the potential (write scan signal) WS of the scan line 31, the potential (power supply potential) DS of the power supply line 32, the potential of the signal line 33 ($V_{sig}$/$V_{ofs}$) and the gate potential $V_g$ and source potential $V_s$ of the drive transistor 22.

(Light Emission Period of the Previous Display Frame)

In the timing waveform diagram shown in FIG. 3, the period prior to time $t_{11}$ is the light emission period of the organic EL element 21 in the previous display frame. During this light emission period in the previous display frame, the power supply potential DS of the power supply line 32 is at the first power supply potential (hereinafter referred to as the "high potential") $V_{CCP}$, and the write transistor 23 is not conducting.

Figure 4A:
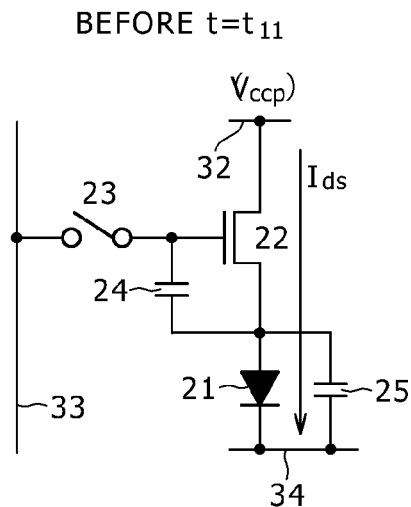
FIGS. 4A to 4D are explanatory diagrams (1) of the basic circuit operation of the organic EL display to which the present disclosure is applied.

At this time, the drive transistor 22 is designed to operate in the saturation region. As a result, a drive current (drain-to-source current) $I_{ds}$ commensurate with a gate-to-source voltage $V_{gs}$ of the drive transistor 22 is supplied from the power supply line 32 to the organic EL element 21 via the drive transistor 22 as illustrated in FIG. 4A. This allows for the organic EL element 21 to emit light at the brightness commensurate with the level of the drive current $I_{ds}$.

(Preparation Period for Threshold Correction)

Figure 4B:
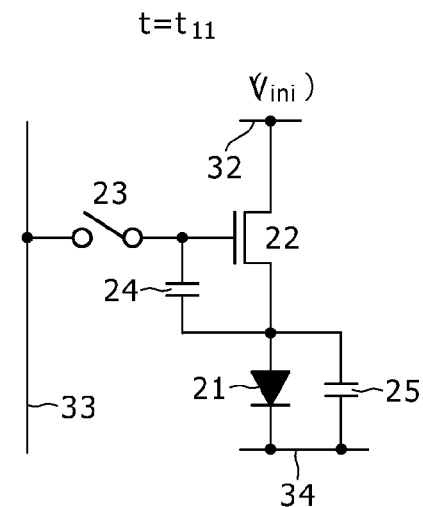

At time $t_{11}$, a new display frame (current display frame) for progressive scan begins. Then, the potential DS of the power supply line 32 changes from the high potential $V_{ccp}$ to the second power supply potential $V_{ini}$ (hereinafter referred to as the "lower potential") sufficiently lower than $V_{ofs}$-$V_{th}$ where $V_{ofs}$ is the reference potential of the signal line 33 as illustrated in FIG. 4B.

Here, we let the threshold voltage of the organic EL element 21 be denoted by $V_{the1}$ and the potential of the common power supply line 34 (cathode potential) by $V_{cath}$. At this time, assuming that the low potential $V_{ini}$ has the following relationship with the above voltages: $V_{ini}<V_{the1}+V_{cath}$, the source potential $V_s$ of the drive transistor 22 is almost equal to the low potential $V_{ini}$. As a result, the organic EL element 21 is reverse-biased, causing the same element 21 to stop emitting light.

Figure 4C:
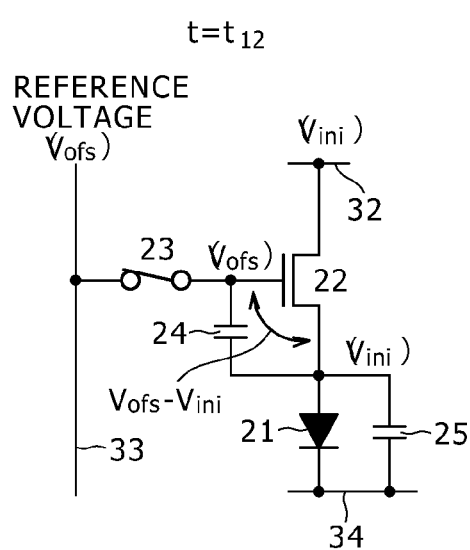

Next, the potential WS of the scan line 31 changes from low to high potential at time $t_{12}$, thus bringing the write transistor 23 into conduction as illustrated in FIG. 4C. At this time, the reference voltage $V_{ofs}$ is supplied from the signal output circuit 60 to the signal line 33. As a result, the gate potential $V_g$ of the drive transistor 22 becomes equal to the reference voltage $V_{ofs}$. On the other hand, the source potential $V_s$ of the drive transistor 22 is sufficiently lower than the reference voltage $V_{ofs}$, i.e., equal to the low potential $V_{ini}$.

At this time, the gate-to-source voltage $V_{gs}$ of the drive transistor 22 is equal to $V_{ofs}$-$V_{ini}$. Here, the threshold correction described later cannot be performed unless $V_{ofs}$-$V_{ini}$ is larger than the threshold voltage $V_{th}$ of the drive transistor 22. Therefore, it is necessary to ensure that the potential relationship $V_{ofs}$-$V_{ini}>V_{th}$ holds.

As described above, the gate potential $V_g$ of the drive transistor 22 is fixed at the reference voltage $V_{ofs}$, and then the source potential $V_s$ is fixed at the low potential $V_{ini}$ for initialization as a preparation (preparation for threshold correction) prior to the threshold correction process (threshold correction operation) which will be described later. Therefore, the reference voltage $V_{ofs}$ and low potential $V_{ini}$ serve respectively as the initial potentials of the gate potential $V_g$ and source potential $V_s$ of the drive transistor 22.

(Threshold Correction Period)

Figure 4D:
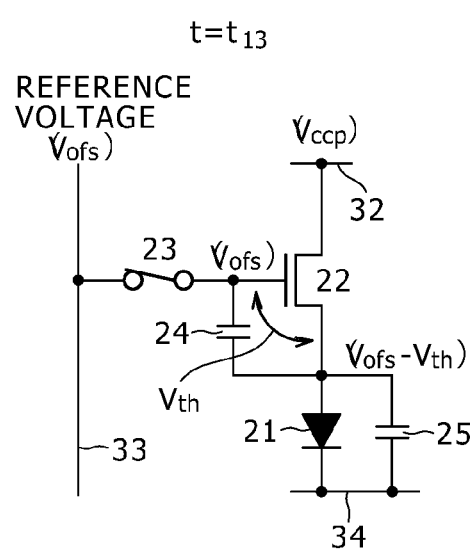

Next, when the potential DS of the power supply line 32 changes from the low potential $V_{ini}$ to the high potential $V_{ccp}$ at $t_{13}$ as illustrated in FIG. 4D, the threshold correction process begins with the gate potential $V_g$ of the drive transistor 22 maintained at the reference voltage $V_{ofs}$. That is, the source potential $V_s$ of the drive transistor 22 begins to rise to the gate potential $V_g$ of the drive transistor 22 minus the threshold voltage $V_{th}$ thereof.

Here, the process adapted to change the source potential $V_s$ relative to the initial potential $V_{ofs}$ of the gate voltage $V_g$ of the drive transistor 22 in such a manner that the same potential $V_s$ varies to the initial potential $V_{ofs}$ minus the threshold voltage $V_{th}$ of the drive transistor 22 is referred to as the threshold correction process for convenience. As this threshold correction process progresses, the gate-to-source voltage $V_{gs}$ of the drive transistor 22 will soon converge to the threshold voltage $V_{th}$ of the drive transistor 22. The voltage corresponding to the threshold voltage $V_{th}$ is held by the holding capacitor 24.

It should be noted that the potential $V_{cath}$ of the common power supply line 34 is set so as to bring the organic EL element 21 into a cutoff state during the period in which the threshold correction process is performed (threshold correction period) so that the current flows exclusively through the holding capacitor 24, and not through the organic EL element 21.

Figure 5A:
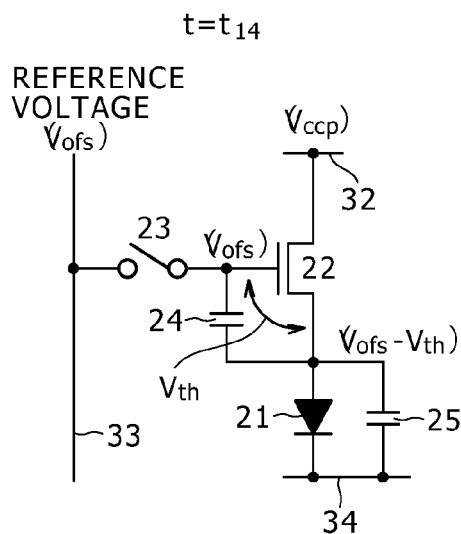
FIGS. 5A to 5D are explanatory diagrams (2) of the basic circuit operation of the organic EL display to which the present disclosure is applied.

Next, the potential WS of the scan line 31 changes to low potential at time $t_{14}$, thus bringing the write transistor 23 out of conduction as illustrated in FIG. 5A. At this time, the gate electrode of the drive transistor 22 is electrically disconnected from the signal line 33, thus causing the gate electrode to float. However, the gate-to-source voltage $V_{gs}$ is equal to the threshold voltage $V_{th}$ of the drive transistor 22. As a result, the drive transistor 22 is in a cutoff state. Therefore, the drain-to-source current $I_{ds}$ does not flow through the drive transistor 22.

(Signal Writing & Mobility Correction Period)

Figure 5B:
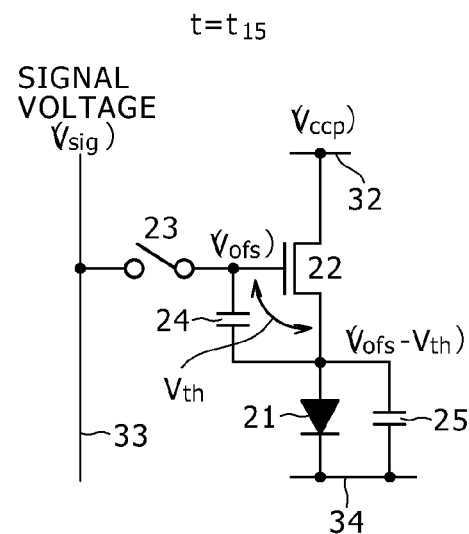
Figure 5C:
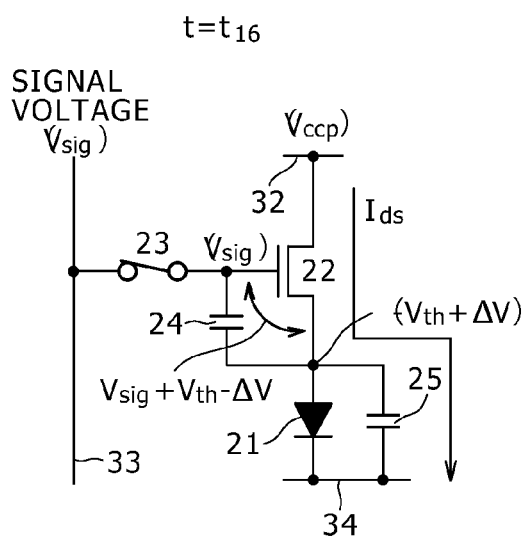

Next, the potential of the signal line 33 changes from the reference voltage $V_{ofs}$ to the video signal voltage $V_{sig}$ at time $t_{15}$ as illustrated in FIG. 5B. Then, the potential WS of the scan line 31 changes to high potential at time $t_{16}$, thus bringing the write transistor 23 into conduction and allowing for the same transistor 23 to sample the video signal voltage $V_{sig}$ and write this voltage to the pixel 20 as illustrated in FIG. 5C.

As a result of writing of the signal voltage $V_{sig}$ by the write transistor 23, the gate potential $V_g$ of the drive transistor 22 becomes equal to the signal voltage $V_{sig}$. Then, when the drive transistor 22 is driven by the video signal voltage $V_{sig}$, the threshold voltage $V_{th}$ of the drive transistor 22 is cancelled out by the voltage corresponding to the threshold voltage $V_{th}$ held by the holding capacitor 24. The principle behind this threshold cancellation will be described in detail later.

At this time, the organic EL element 21 is in a cutoff state (high impedance state). As a result, the current (drain-to-source current $I_{ds}$) commensurate with the signal voltage $V_{sig}$ flowing from the power supply line 32 to the drive transistor 22 flows into the equivalent capacitor of the organic EL element 21 and the auxiliary capacitor 25. This initiates the charging of the equivalent capacitor of the organic EL element 21 and the auxiliary capacitor 25.

As the equivalent capacitor of the organic EL element 21 and the auxiliary capacitor 25 are charged, the source potential $V_s$ of the drive transistor 22 rises over time. At this time, the variation in the threshold voltage $V_{th}$ of the drive transistor 22 between the pixels has already been cancelled out. As a result, the drain-to-source current $I_{ds}$ of the drive transistor 22 is dependent on a mobility $\mu$ of the same transistor 22. It should be noted that the mobility $\mu$ of the drive transistor 22 is the mobility of the semiconductor thin film forming the channel of the same transistor 22.

Here, we assume that the ratio of the voltage $V_{gs}$ held by the holding capacitor 24 to the video signal voltage $V_{sig}$, i.e., a write gain G, is 1 (ideal). As a result, when the source potential $V_s$ of the drive transistor 22 rises to $V_{ofs}-V_{th}+\Delta V$, the gate-to-source voltage $V_{gs}$ of the drive transistor 22 becomes equal to $V_{sig}-V_{ofs}+V_{th}-\Delta V$.

That is, an increment $\Delta V$ in the source potential $V_s$ of the drive transistor 22 acts so that it is subtracted from the voltage $(V_{sig}-V_{ofs}+V_{th})$ held by the holding capacitor 24. In other words, the increment $\Delta V$ acts so that the holding capacitor 24 is discharged. In other words, the increment $\Delta V$ in the source potential $V_s$ is negatively fed back to the holding capacitor 24. As a result, the increment $\Delta V$ in the source potential $V_s$ serves as a negative feedback amount.

As described above, it is possible to cancel out the dependence of the drain-to-source current $I_{ds}$ of the drive transistor 22 on the mobility $\mu$ by negatively feeding the feedback amount $\Delta V$ commensurate with the drain-to-source current $I_{ds}$ flowing through the drive transistor 22 back to the gate-to-source voltage $V_{gs}$. This cancellation is the mobility correction process adapted to correct the variation in the mobility $\mu$ of the drive transistor 22 between the pixels.

More specifically, the higher the amplitude $V_{in}$ (=$V_{sig}-V_{ofs}$) of the video signal written to the gate electrode of the drive transistor 22, the larger the drain-to-source current $I_{ds}$, and therefore the larger the absolute value of the negative feedback amount $\Delta V$. As a result, the mobility correction process is performed according to the emission brightness.

On the other hand, if the video signal amplitude $V_{in}$ is constant, the larger the mobility $\mu$ of the drive transistor 22, the larger the absolute value of the negative feedback amount $\Delta V$, thus eliminating the variation in the mobility $\mu$ between the pixels. Therefore, the negative feedback amount $\Delta V$ can be also referred to as the correction amount for the mobility correction process. The principle behind the mobility correction will be described in detail later.

(Light Emission Period)

Figure 5D:
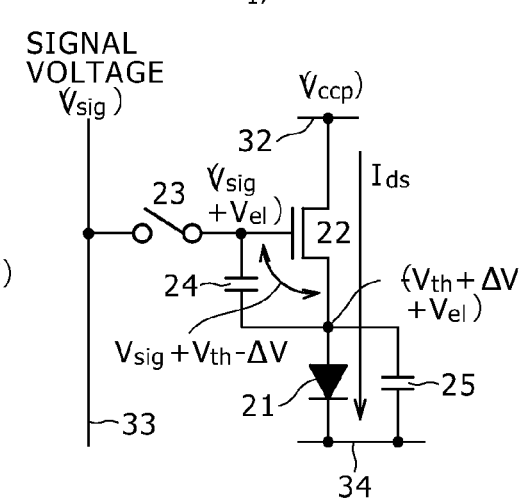

Next, the potential WS of the scan line 31 changes to low potential at time $t_{17}$, thus bringing the write transistor 23 out of conduction as illustrated in FIG. 5D. As a result, the gate electrode of the drive transistor 22 is electrically disconnected from the signal line 33, thus causing the gate electrode to float.

Here, when the gate electrode of the drive transistor 22 floats, the gate potential $V_g$ of the drive transistor 22 changes with change in the source potential $V_s$ of the drive transistor 22 because the holding capacitor 24 is connected between the gate and source of the drive transistor 22. The change in the gate potential $V_g$ of the drive transistor 22 with change in the source potential $V_s$ as described above is the bootstrapping action of the holding capacitor 24.

When the gate electrode of the drive transistor 22 floats, and when the drain-to-source current $I_{ds}$ of the drive transistor 22 begins to flow through the organic EL element 21 at the same time, the anode potential of the same element 21 rises with increase in the drain-to-source current $I_{ds}$.

Then, when the anode potential of the organic EL element 21 exceeds $V_{the1}+V_{cath}$, the drive current begins to flow through the same element 21, allowing for the same element 21 to start emitting light. On the other hand, the rise of the anode potential of the organic EL element 21 is none other than the rise of the source potential $V_s$ of the drive transistor 22. Then, as the source potential $V_s$ of the drive transistor 22 rises, the gate voltage Vg of the same transistor 22 also rises thanks to the bootstrapping action of the holding capacitor 24.

At this time, assuming that the bootstrap gain is 1 (ideal), the increment in the gate potential $V_g$ is equal to the increment in the source potential $V_s$. Therefore, the gate-to-source voltage $V_{gs}$ of the drive transistor 22 is maintained constant at $V_{sig}-V_{ofs}+V_{th}-\Delta V$ during the light emission period. Then, the potential of the signal line 33 changes from the video signal voltage $V_{sig}$ to the reference voltage $V_{ofs}$ at time $t_{18}$.

In the above series of circuit operations, the preparation for threshold correction, threshold correction, writing of the signal voltage $V_{sig}$ (signal writing) and mobility correction are performed during one horizontal scan period (1H). Further, the signal writing and mobility correction are performed during a period from time $t_{16}$ to time $t_{17}$.

[Divided Threshold Correction]

It should be noted that although a description has been given of an example of driving method in which the threshold correction is performed only once, this driving method is merely an example, and the present disclosure is not limited thereto. Instead, a driving method adapted to perform the so-called divided threshold correction may be, for example, used. This driving method is designed to perform the threshold correction on two or more separate occasions not only during the 1H period in which the threshold correction is conducted together with the mobility correction and signal writing but also during a plurality of horizontal scan periods preceding the 1H period.

This driving method based on divided threshold correction provides a sufficient amount of time spanning a plurality of horizontal scan periods as a threshold correction period even if the time assigned as a horizontal scan period is reduced due to higher pixel count resulting from higher definition. Therefore, even if the time assigned as a horizontal scan period is reduced, it is possible to provide a sufficient amount of time as a threshold correction period, thus making it possible to positively conduct the threshold correction.

[Principle Behind the Threshold Cancellation]

A description will be given here of the principle behind the threshold cancellation (i.e., threshold correction) of the drive transistor 22. The drive transistor 22 is designed to operate in the saturation region. As a result, the same transistor 22 acts as a constant current source. This allows for the constant drain-to-source current (drive current) $I_{ds}$, given by Formula 1 shown below, to be supplied from the drive transistor 22 to the organic EL element 21.

$$I_{ds}=(\tfrac{1}{2})\mu(W/L)C_{ox}(V_{gs}-V_{th})^2 \qquad (1)$$

where W is the channel width of the drive transistor 22, L the channel length, and $C_{ox}$ the gate capacitance per unit area.

Figure 6A:
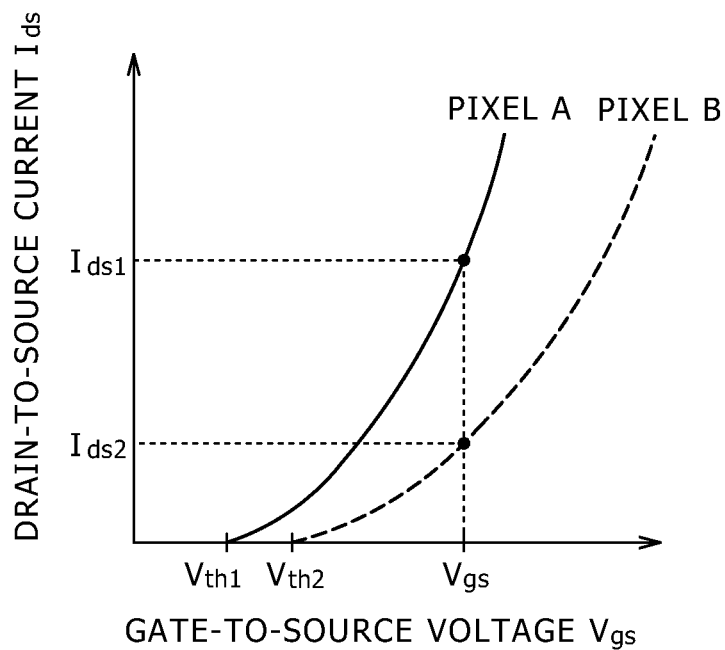
FIG. 6A is a characteristic diagram for describing a problem caused by the variation in a threshold voltage of a drive transistor.

FIG. 6A illustrates the drain-to-source current $I_{ds}$ vs gate-to-source voltage $V_{gs}$ characteristic of the drive transistor 22. As illustrated in the characteristic diagram of FIG. 6A, if the variation in the threshold voltage $V_{th}$ of the drive transistor 22 between the pixels is not cancelled out (corrected), the drain-to-source current $I_{ds}$ for the gate-to-source voltage $V_{gs}$ is $I_{ds1}$ when the threshold voltage $V_{th}$ is $V_{th1}$.

In contrast, when the threshold voltage $V_{th}$ is $V_{th2}$ ($V_{th2}>V_{th1}$) the drain-to-source current $I_{ds}$ for the same gate-to-source voltage $V_{gs}$ is $I_{ds2}$ ($I_{ds2}<I_{ds1}$). That is, when the threshold voltage $V_{th}$ of the drive transistor 22 changes, the drain-to-source current $I_{ds}$ also changes even if the gate-to-source voltage $V_{gs}$ is constant.

In the pixel (pixel circuit) 20 configured as described above, on the other hand, the gate-to-source voltage $V_{gs}$ of the drive transistor 22 during light emission is $V_{sig}-V_{ofs}+V_{th}-\Delta V$ as described earlier. Therefore, when this is substituted into Formula 1, the drain-to-source current $I_{ds}$ is expressed by Formula 2 shown below.

$$I_{ds}=(\tfrac{1}{2})\mu(W/L)C_{ox}(V_{sig}-V_{ofs}-\Delta V)^2 \qquad (2)$$

That is, the term of the threshold voltage $V_{th}$ of the drive transistor 22 has been cancelled out. This makes the drain-to-source current $I_{ds}$, supplied from the drive transistor 22 to the organic EL element 21, independent of the threshold voltage $V_{th}$ of the drive transistor 22. As a result, the drain-to-source current $I_{ds}$ remains unchanged even in the event of a change in the threshold voltage $V_{th}$ of the drive transistor 22 between the pixels due, for example, to manufacturing process variation or change over time, thus making it possible to maintain the light emission brightness of the organic EL element 21 constant.

[Principle Behind the Mobility Correction]

Figure 6B:
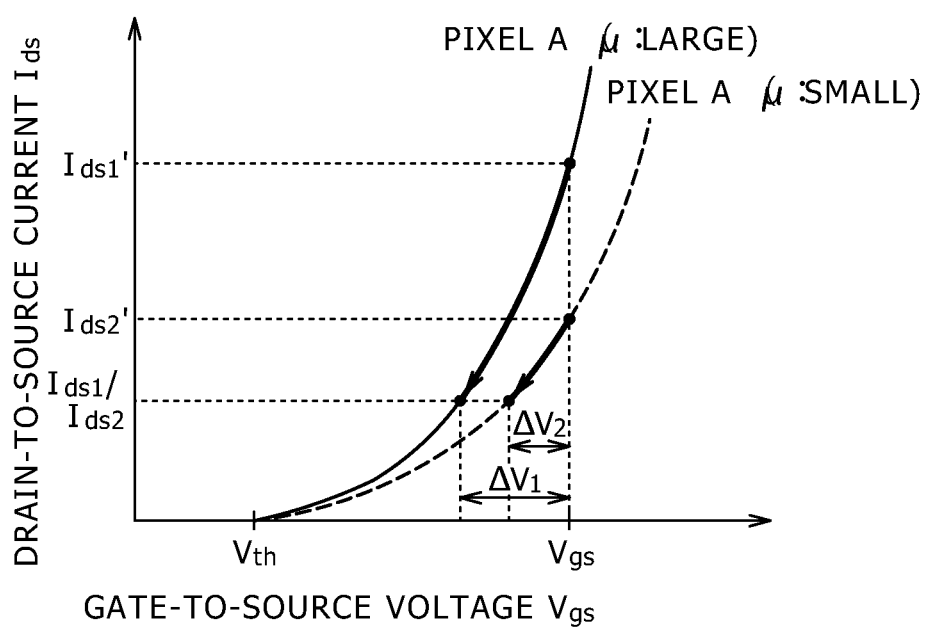
FIG. 6B is a characteristic diagram for describing a problem caused by the variation in mobility of the drive transistor.

A description will be given next of the principle behind the mobility correction of the drive transistor 22. FIG. 6B illustrates characteristic curves comparing a pixel A with the relatively large mobility μ of the drive transistor 22 and a pixel B with the relatively small mobility μ of the same transistor 22. If the drive transistor 22 includes a polysilicon thin film transistor, there is inevitably a variation in the mobility μ between the pixels such as the pixels A and B.

We consider a case in which the signal amplitude $V_{in}$ ($=V_{sig}-V_{ofs}$) of the same level is, for example, written to the gate electrodes of the drive transistors 22 in the pixels A and B when there is a variation in the mobility μ between the pixels A and B. In this case, if the mobility μ is not corrected at all, there will be a large difference between the drain-to-source current $I_{ds1}'$ flowing though the pixel A with the large mobility μ and the drain-to-source current $I_{ds2}'$ flowing through the pixel B with the small mobility μ. If there is a large difference in the drain-to-source current $I_{ds}$ between the pixels due to the variation in the mobility μ between the pixels, the screen uniformity is impaired.

Here, as is clear from the transistor characteristic formula given by Formula 1, the larger the mobility μ, the larger the drain-to-source current $I_{ds}$. Therefore, the larger the mobility μ, the larger the negative feedback amount ΔV. As illustrated in FIG. 6B, a feedback amount $\Delta V_1$ of the pixel A with the large mobility μ is larger than a feedback amount $\Delta V_2$ of the pixel B with the small mobility μ.

Therefore, if the feedback amount ΔV commensurate with the drain-to-source current $I_{ds}$ flowing through the drive transistor 22 is negatively fed back to the gate-to-source voltage $V_{gs}$ in the mobility correction, the larger the mobility μ, the larger the negative feedback amount. This makes it possible to keep the variation in the mobility μ between the pixels to a minimum.

More specifically, if the pixel A with the large mobility μ is corrected with the feedback amount $\Delta V_1$, the drain-to-source current $I_{ds}$ drops significantly from $I_{ds1}'$ to $I_{ds1}$. On the other hand, the feedback amount $\Delta V_2$ of the pixel B with the small mobility μ is small. Therefore, the drain-to-source current $I_{ds}$ drops from $I_{ds2}'$ to $I_{ds2}$, which is not a significant decline. As a result, the drain-to-source current $I_{ds1}$ of the pixel A and the drain-to-source current $I_{ds2}$ of the pixel B are roughly equal, thus correcting the variation in the mobility μ.

Summing up the above, if the pixels A and B have the different mobilities μ, the feedback amount $\Delta V_1$ of the pixel A with the large mobility μ is larger than the feedback amount $\Delta V_2$ of the pixel B with the small mobility μ. That is, the larger the mobility μ, the larger the feedback amount ΔV, and the more the drain-to-source current $I_{ds}$ declines.

Therefore, the levels of the drain-to-source currents $I_{ds}$ of the pixels with the different mobilities μ are evened out by negatively feeding the feedback amount ΔV commensurate with the drain-to-source current $I_{ds}$ flowing through the drive transistor 22 back to the gate-to-source voltage $V_{gs}$. This makes it possible to correct the variation in the mobility μ between the pixels. That is, negatively feeding the feedback amount (correction amount) ΔV commensurate with the current (drain-to-source current $I_{ds}$) flowing through the drive transistor 22 back to the gate-to-source voltage $V_{gs}$ of the drive transistor 22, i.e., the holding capacitor 24, is the mobility correction.

A description will be given below of the organic EL display according to first and second embodiments of the present disclosure whose basic configuration and circuit operation are as described above.

2. First Embodiment

Figure 7:
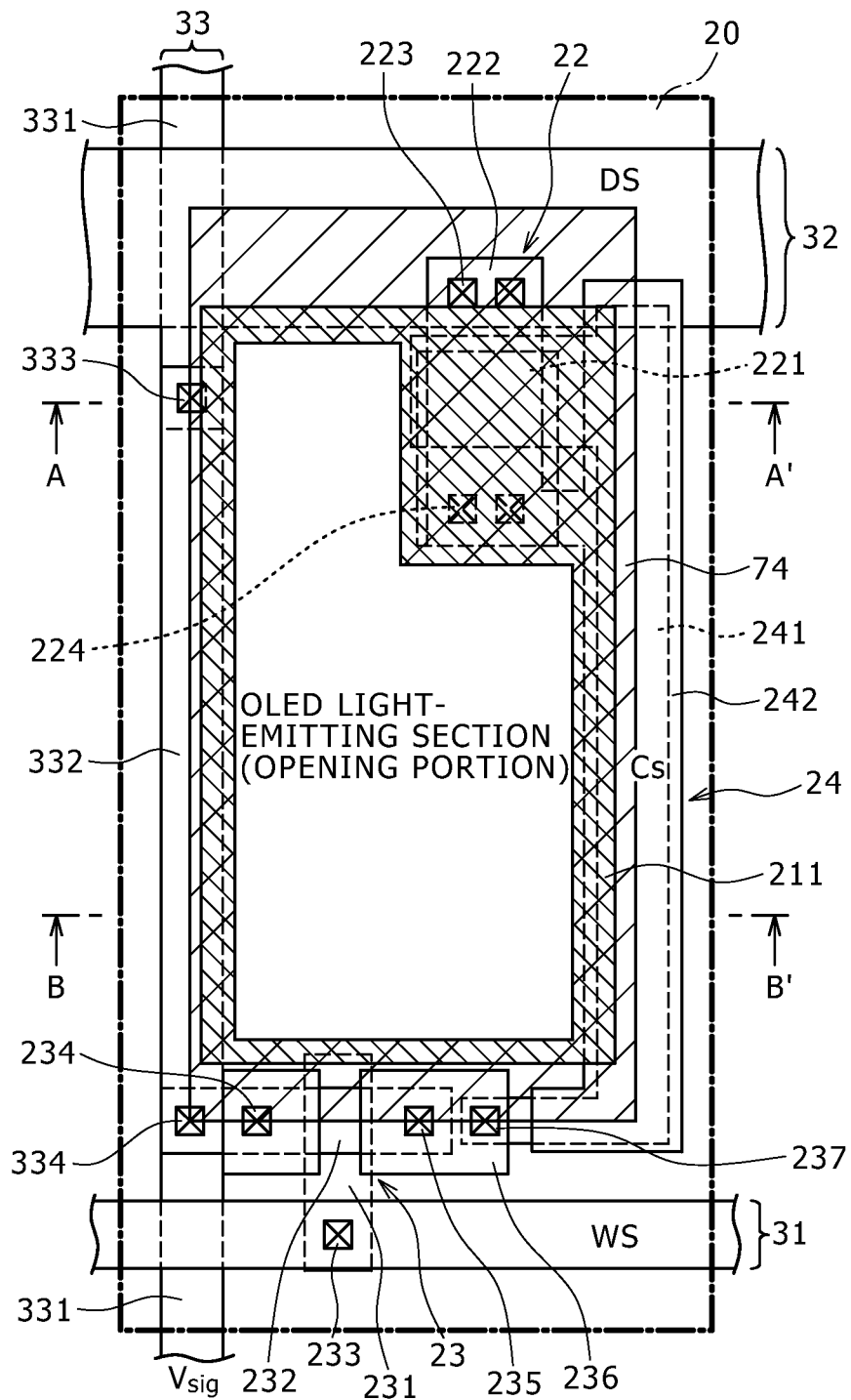
FIG. 7 is a schematic plan view illustrating the pixel structure of the organic EL display according to a first embodiment of the present disclosure.
Figure 8:
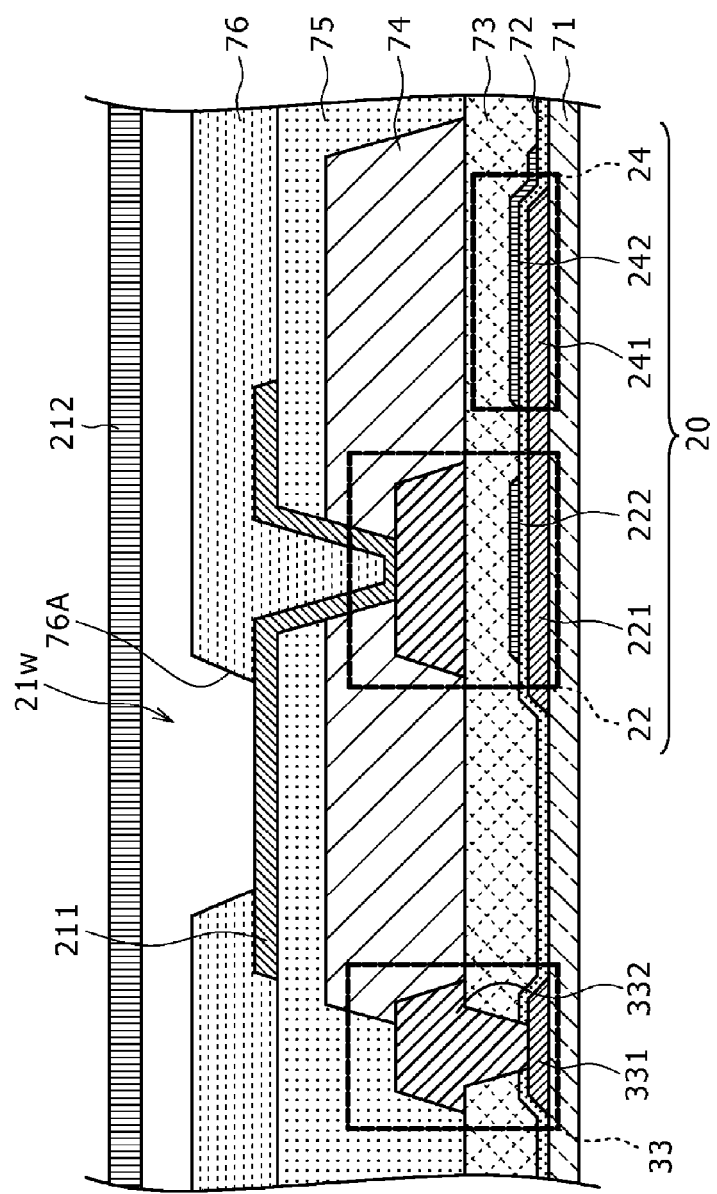
FIG. 8 is a sectional view taken along line of sight A-A' indicated by the arrows in FIG. 7.
Figure 9:
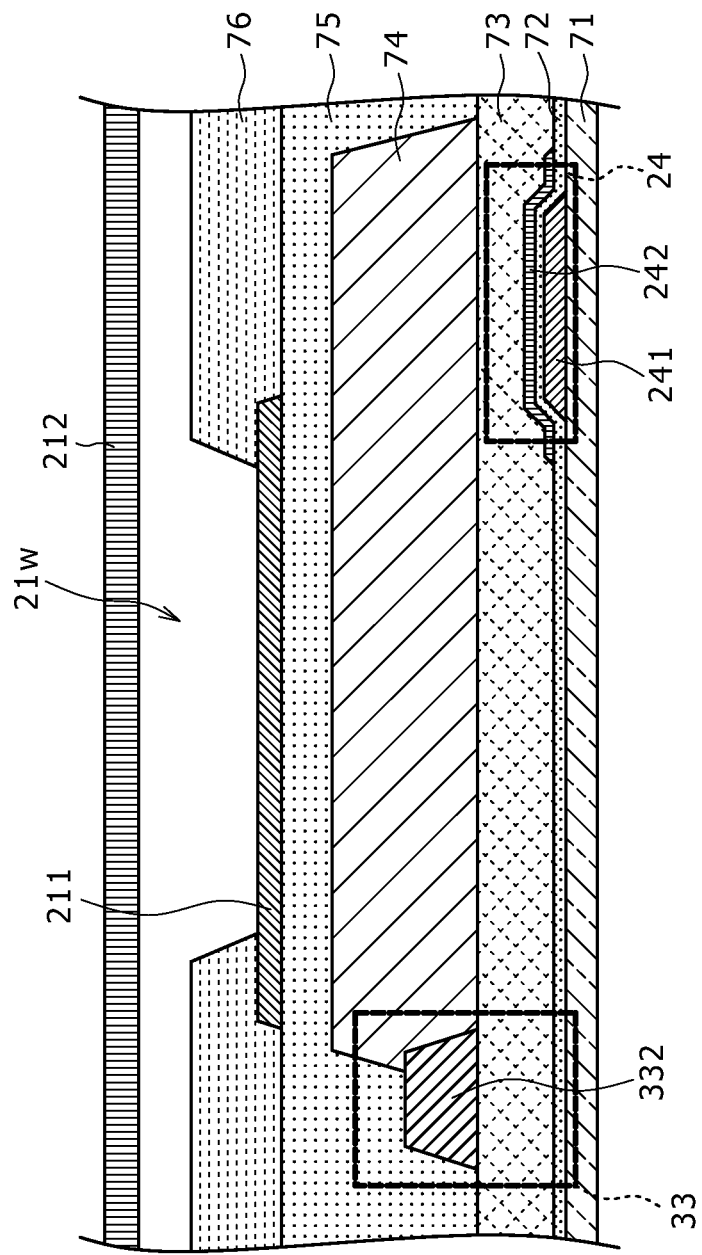
FIG. 9 is a sectional view taken along line of sight B-B' indicated by the arrows in FIG. 7.

FIG. 7 is a schematic plan view illustrating the pixel structure of the organic EL display according to the first embodiment of the present disclosure. Further, FIG. 8 is a sectional view taken along line of sight A-A' indicated by the arrows in FIG. 7. FIG. 9 is a sectional view taken along line of sight B-B' indicated by the arrows in FIG. 7.

The organic EL display according to the first embodiment has a bottom emission structure (scheme) in which light emitted by the organic EL elements is extracted from the rear side of the transparent insulating substrate on which the pixel circuits, each including TFTs (Thin Film Transistors), capacitors and so on, are formed. Further, the organic EL display according to the first embodiment includes, as organic EL elements, white organic EL elements adapted to emit white light that are used in combination with a color filter, thus allowing for light of different colors such as RGB light to be extracted.

In particular, the pixel circuit (drive circuit of the organic EL element $21_W$) 20 including the drive transistor 22 and holding capacitor 24 is formed on a transparent insulating substrate such as a glass substrate 71 as illustrated in FIGS. 8 and 9. More specifically, a gate electrode 221 of the drive transistor 22, one electrode 241 of the holding capacitor 24 and an underlying interconnect 331 of the signal line 33 are made of an interconnect material such as molybdenum (Mo) and formed on the glass substrate 71. The glass substrate 71 having the pixel circuits 20, each including TFTs, formed thereon is generally referred to as a TFT substrate.

A semiconductor layer 222 forming the channel region and source/drain regions of the drive transistor 22 and other electrode 242 of the holding capacitor 24 are formed respectively above the gate electrode 221 of the drive transistor 22 and the one electrode 241 of the holding capacitor 24 with a gate insulating film 72 provided therebetween. A color filter 74 is formed directly on-chip above the pixel circuit 20 with an insulating film 73 provided therebetween. That is, the color filter 74 is an on-chip color filter.

An overlying interconnect 332 of the signal line 31 is made of an interconnect material such as aluminum (Al) and formed on the insulating film 73 with contact (electrical connection) made with the underlying interconnect 331. Further, an insulating planarizing film 75 is stacked on top of the color filter 74, and an anode electrode 211 of the white organic EL element $21_W$ is formed on the insulating planarizing film 75 for each pixel.

The white organic EL element $21_W$ is formed in a concave portion $76_A$ of a window insulating film 76 stacked on the insulating planarizing film 75. The concave portion $76_A$ of the window insulating film 76 serves as a light-emitting section of the white organic EL element $21_W$, i.e., an OLED opening. A cathode electrode 212 of the white organic EL element $21_W$ is formed to be shared by all the pixels. It should be noted that the cathode electrode 212 is not shown in FIG. 7.

As described above, the organic EL display according to the first embodiment uses, as the organic EL elements 21, the white organic EL elements $21_W$ adapted to emit white light, thus providing light of different colors such as RGB light by using the on-chip color filter 74. As the white organic EL elements $21_W$, multistage RGB organic EL elements, and more specifically, organic EL elements having a tandem structure formed by stacking the RGB light-emitting layers one on top of the other with a connecting layer provided therebetween may be, for example, used.

Further, the organic EL display according to the first embodiment has a bottom emission structure in which light emitted by the white organic EL elements $21_W$ is extracted from the rear side of the glass substrate 71 on which the pixel circuits 20 are formed. When a bottom emission structure is used, the light extraction region is restricted by the presence of the circuit components and interconnects on the glass substrate 71. As a result, the light utilization ratio of the organic EL elements 21 is generally lower than a top emission structure in which light is extracted from the front side of the substrate.

In the organic EL display according to the first embodiment, however, each of the pixel circuits 20 includes a small number of circuit components, namely, two transistors (22 and 23) and a capacitor (24). As a result, only a small number of transistors and interconnects are formed on the TFT substrate (glass substrate 71). Therefore, even if a bottom emission structure is used, it is possible to provide better utilization ratio of light emitted by the organic EL elements 21 than when the pixel circuits, each including three or more transistors and other components, are used.

In particular, as is clear from FIG. 7, the signal line 33 including the underlying interconnect 331 and overlying interconnect 332 runs longitudinally on the left edge side of the pixel (pixel circuit) 20, and more specifically, along the left edge of the light-emitting section of the white organic EL element $21_W$. Contact (electrical connection) is made between the underlying interconnect 331 and overlying interconnect 332 by contact portions 333 and 334 at two locations in the pixel 20.

The power supply line 32, made of aluminum (Al) or other interconnect material, is formed laterally on the top edge side of the pixel 20, and more specifically, along the top edge of the light-emitting section of the white organic EL element $21_W$. The drive transistor 22 is formed near the power supply line 32. As described earlier, the drive transistor 22 includes the gate electrode 221 and semiconductor layer 222. The gate electrode 221 is formed on the glass substrate 71. The semiconductor layer 222 serves as the channel region and source/drain regions and is formed above the gate electrode 221 with the gate insulating film 72 provided therebetween.

The gate electrode 221 of the drive transistor 22 is formed integrally with the lower electrode 241 of the holding capacitor 24 along the top edge of the light-emitting section of the white organic EL element $21_W$. Contact is made between one of the source/drain regions of the semiconductor layer 222 and the upper electrode 242 of the holding capacitor 24 by means of a contact portion 224. On the other hand, contact is made between the other source/drain region of the semiconductor layer 222 and the power supply line 32 by means of a contact portion 223.

The holding capacitor 24 has the gate insulating film 72 serving as a dielectric sandwiched between the lower and upper electrodes 241 and 242 and is formed on the right edge side of the pixel 20 to span the almost entire longitudinal region thereof, and more specifically, along the right edge of the light-emitting section of the white organic EL element $21_W$. The capacitance of the holding capacitor 24 is determined by the area of the region between the lower and upper electrodes 241 and 242 opposed to each other, the distance between the two electrodes 241 and 242 and the dielectric constant of the gate insulating film 72.

The scan line 31, made of aluminum (Al) or other interconnect material, is formed laterally on the bottom edge side of the pixel 20. The write transistor 23 is formed near the scan line 31. The write transistor 23 includes a gate electrode 231 and semiconductor layer 232. The gate electrode 231 is made, for example, of molybdenum (Mo) and formed on the glass substrate 71. The semiconductor layer 232 serves as the channel region and source/drain regions and is formed above the gate electrode 231 with the gate insulating film 72 provided therebetween.

The gate electrode of the write transistor 23 is located near the bottom edge of the light-emitting section of the white organic EL element $21_W$. Contact is made between the gate electrode and the scan line 31 by means of a contact portion 233. Contact is made between one of the source/drain regions of the semiconductor layer 232 and the signal line 33 by means of a contact portion 234. The other source/drain region of the semiconductor layer 232 is electrically connected to the lower electrode 241 of the holding capacitor 24 via a contact portion 235, metal interconnect 236 and contact portion 237.

The lower electrode 241 of the holding capacitor 24 is formed integrally with the gate electrode 221 of the drive transistor 22 as described earlier. Thanks to contact made with the lower electrode 241 of the holding capacitor 24, therefore, the other source/drain region of the write transistor 23 is electrically connected to the gate electrode 221 of the drive transistor 22.

In the pixel 20, the white organic EL element $21_W$ is formed in the center surrounded by the signal line 33 on the left, holding capacitor 24 on the right, the power supply line 32 on the top and the scan line 31 on the bottom, i.e., in the concave portion (opening portion) $76_A$ of the window insulating film 76, in such a manner as to avoid the region where the drive transistor 22 is formed. The anode electrode 211 of the white organic EL element $21_W$ is electrically connected to the other source/drain region of the drive transistor 22 and the upper electrode 242 of the holding capacitor 24.

The color filter 74 is formed below the white organic EL element $21_W$ and along the opening of the concave portion $76_A$ of the window insulating film 76 in such a manner as to avoid the drive transistor 22. It should be noted that the color filter 74 is hatched in FIG. 7 for clear identification. On the other hand, the anode electrode 211 of the white organic EL element $21_W$ is shaded.

As described above, the light-emitting section of the white organic EL element $21_W$ and the color filter 74 are surrounded by the metal interconnects such as the signal line 33, power supply line 32, gate electrode 221 of the drive transistor 22, electrode 241 of the holding capacitor 24 and gate electrode 231 of the write transistor 23. As is clear from FIGS. 8 and 9, these metal interconnects are primarily formed in the layer where the drive circuit of the white organic EL element $21_W$ is formed.

Thus, the metal interconnects around the light-emitting section (opening portion) of the white organic EL element $21_W$ and the color filter 74 act as a light-shielding layer adapted to shield light leaking between the different color filters of the color filter 74. This makes it possible to prevent white light leaks between the filters without forming a light-shielding layer between every two filters of different color filter 74, in other words, without providing a process step of forming a light-shielding layer. As a result, it is possible to keep the aggravation of color reproducibility caused by white light leaks and color shift to a minimum without increasing the number of process steps in using the white organic EL elements $21_W$ and color filter 74 in combination.

Here, the metal interconnects around the light-emitting section of the white organic EL element $21_W$ and the color filter 74 are preferably formed to overlap the periphery of the color filter 74. The reason for this is that because when the color filter 74 is formed, a taper level difference is formed on the periphery of the same filter 74, the overlapping can suppress the impact of the taper level difference. At this time, it is possible to positively suppress the impact of the taper level difference by ensuring that a metal interconnect 77 overlaps the periphery of the color filter 74 by as much as or more than the thickness of the color filter 74.

Modification Example

Figure 10:
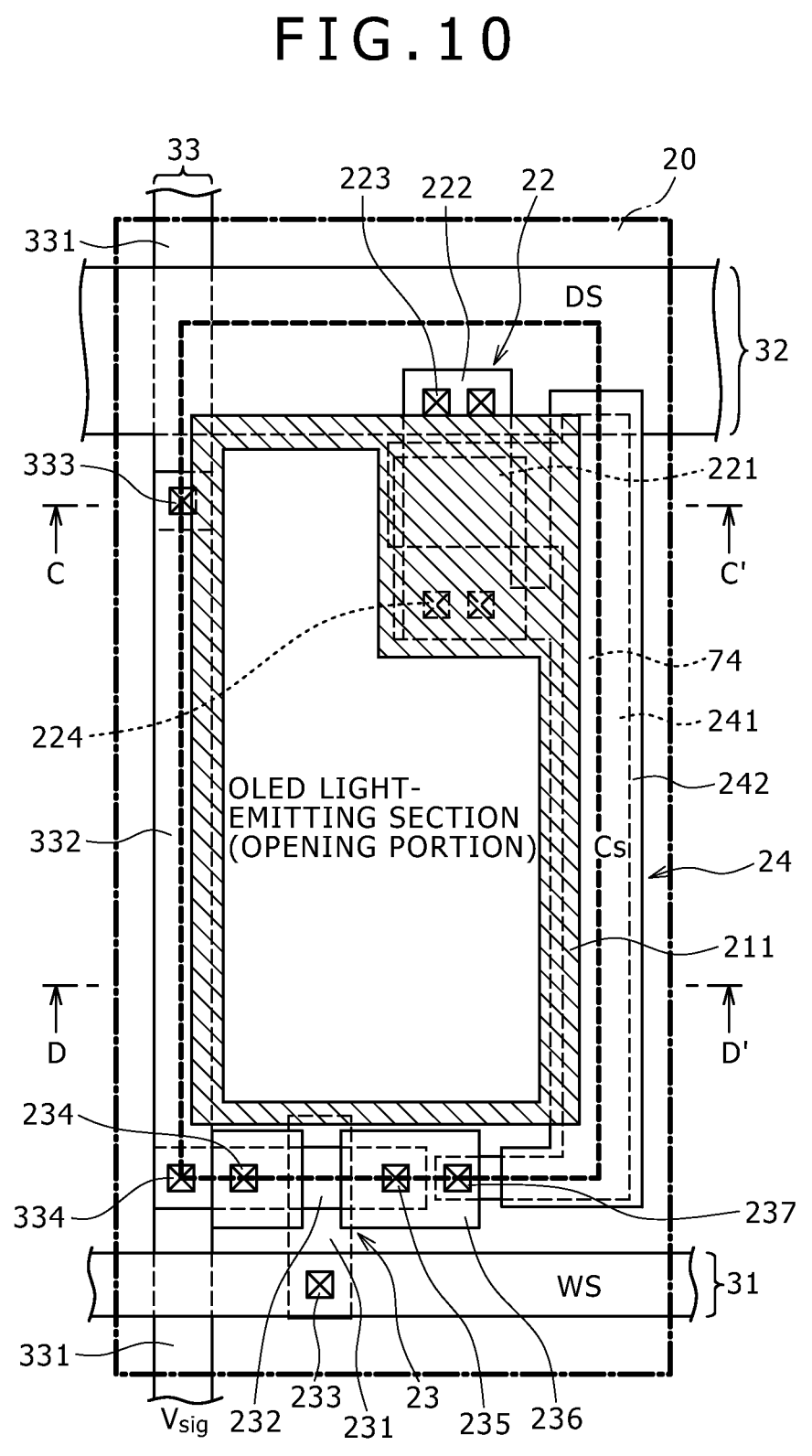
Figure 11:
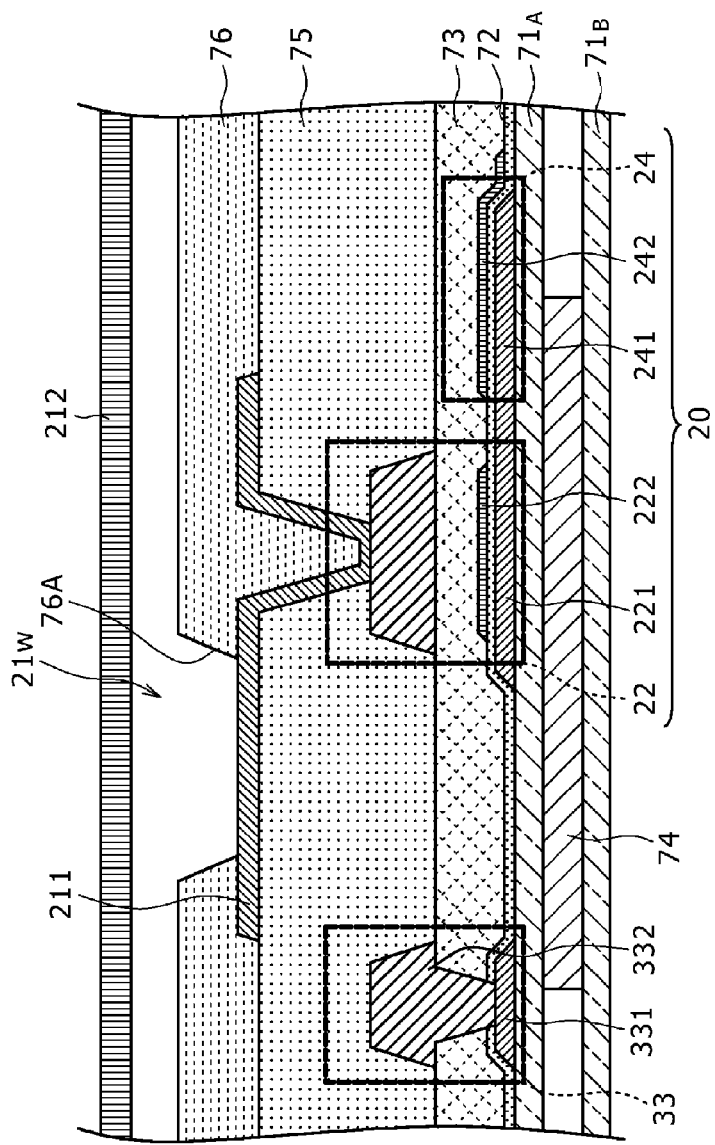
FIG. 11 is a sectional view taken along line of sight C-C' indicated by the arrows in FIG. 10.
Figure 12:
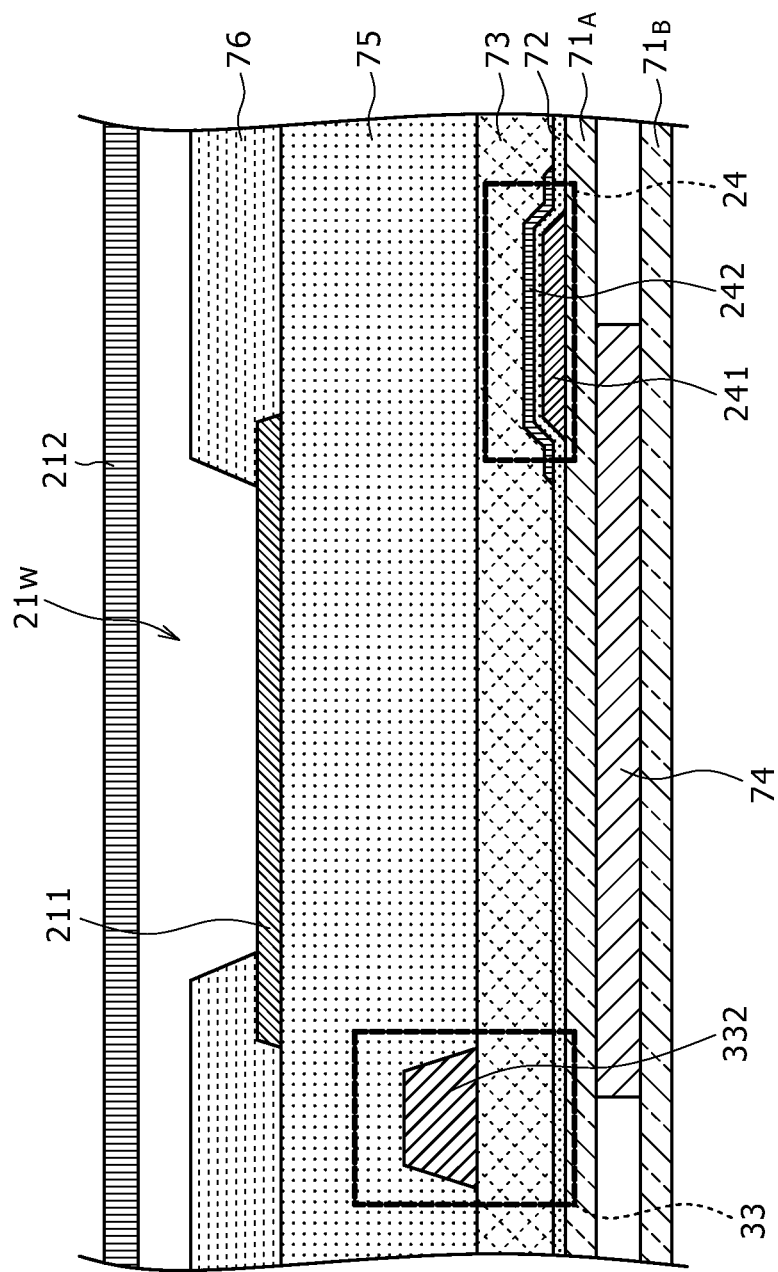
FIG. 12 is a sectional view taken along line of sight D-D' indicated by the arrows in FIG. 10.

A description has been given of an example in which the present embodiment is applied to the organic EL display having the color filter 74 formed on-chip. However, the present embodiment is also applicable to an organic EL display having the color filter 74 attached to its substrate. FIGS. 10 to 12 illustrate the pixel structure of the organic EL display having the color filter 74 attached to its substrate.

FIG. 10 is a schematic plan view illustrating the pixel structure of the organic EL display having the color filter 74 attached to its substrates. On the other hand, FIG. 11 is a sectional view taken along line of sight C-C' indicated by the arrows in FIG. 10, and FIG. 12 is a sectional view taken along line of sight D-D' indicated by the arrows in FIG. 10. In FIG. 10, the color filter 74 is shown by a dashed line. As illustrated in FIGS. 11 and 12, the color filter 74 is sandwiched between and attached to two substrates $71_A$ and $71_B$.

Thus, it is also possible to achieve the same action and effect in the organic EL display having the color filter 74 attached to the substrates $71_A$ and $71_B$ as in the first embodiment by forming the metal interconnects in such a manner as to surround the light-emitting section of the white organic EL element $21_W$ and the color filter 74. At this time, the metal interconnects include the signal line 33, power supply line 32, gate electrode 221 of the drive transistor 22, electrode 241 of the holding capacitor 24 and gate electrode 231 of the write transistor 23 and so on.

3. Second Embodiment

Incidentally, if a bottom emission structure is used, and particularly when the color filter 74 is arranged within the region where the transistors making up the drive circuit of the white organic EL element $21_W$ are formed, the characteristics of the transistors may change. More specifically, the material of the color filter 74 is charged by light emitted from the own pixel, thus changing (shifting) the characteristics of the transistors making up the drive circuit as illustrated in FIG. 13.

Figure 13:
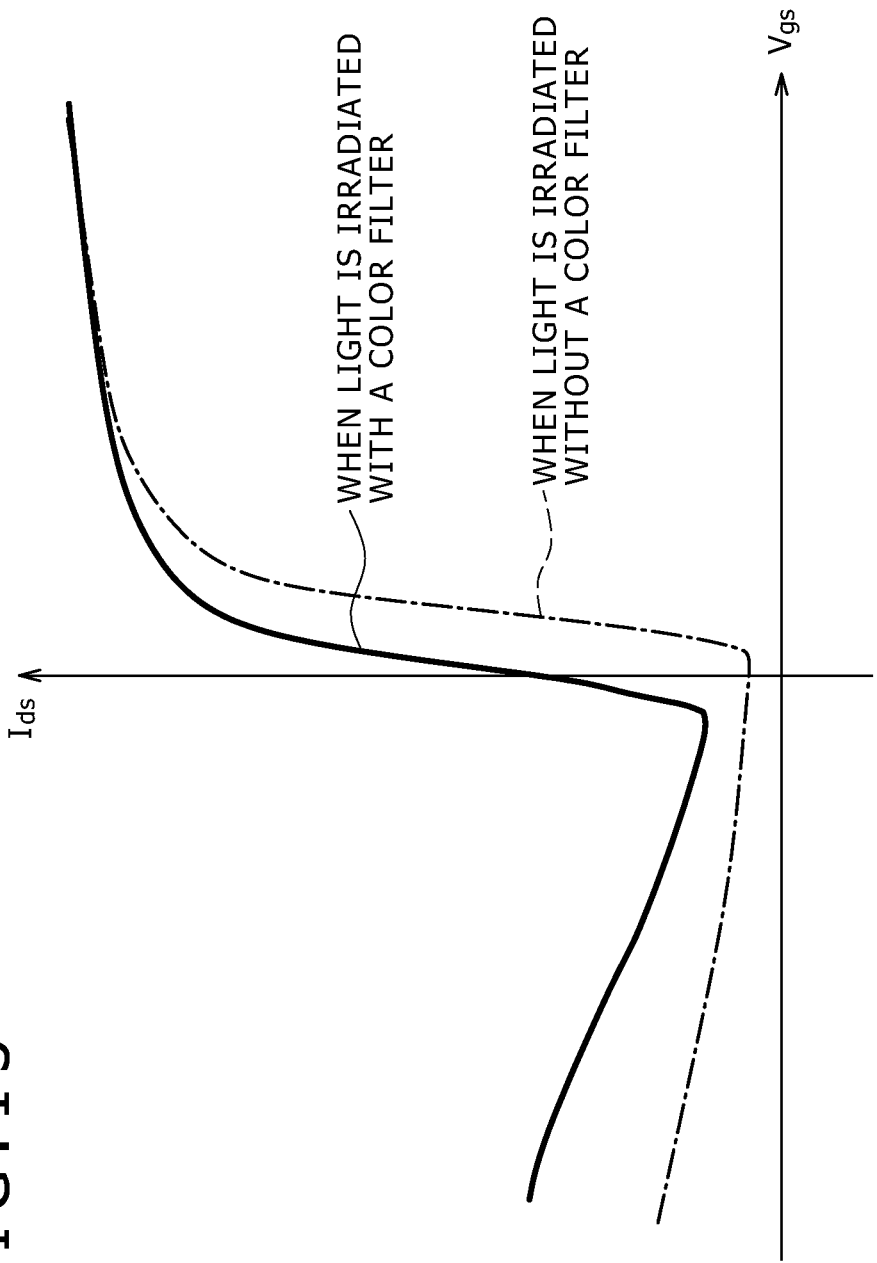
FIG. 13 is a characteristic diagram of a gate-to-source voltage vs a drain-to-source current of an N-channel transistor when light is irradiated to the transistor with and without the color filter.

FIG. 13 illustrates, as an example, the gate-to-source voltage $V_{gs}$ vs drain-to-source current $I_{ds}$ characteristic of an N-channel transistor when light is irradiated to the transistor with and without the color filter 74. The material of the color filter 74 is charged by light emitted from the own pixel, thus affecting the channel of the transistor and shifting the threshold voltage $V_{th}$ of the transistor in the negative direction. Further, the leak current increases in the OFF state of the transistor.

Then, if the characteristic of the write transistor 23 shifts under the influence of the charging of the color filter 74 in the organic EL display having the mobility correction function described above, the charge does not leak from the holding capacitor 24 during the light emission period, thus resulting in lower brightness. On the other hand, if the characteristic of the drive transistor 22 shifts under the influence of the charging of the color filter 74, the threshold voltage $V_{th}$ shifts during light emission despite the fact that the variation in the threshold voltage $V_{th}$ has been corrected by the threshold correction function, thus resulting in uneven brightness.

The organic EL display according to the second embodiment which will be described below has been implemented to resolve the problem caused by the charging of the material of the color filter 74. A description will be given below of the organic EL display according to the second embodiment with reference to FIGS. 14 to 16.

Figure 14:
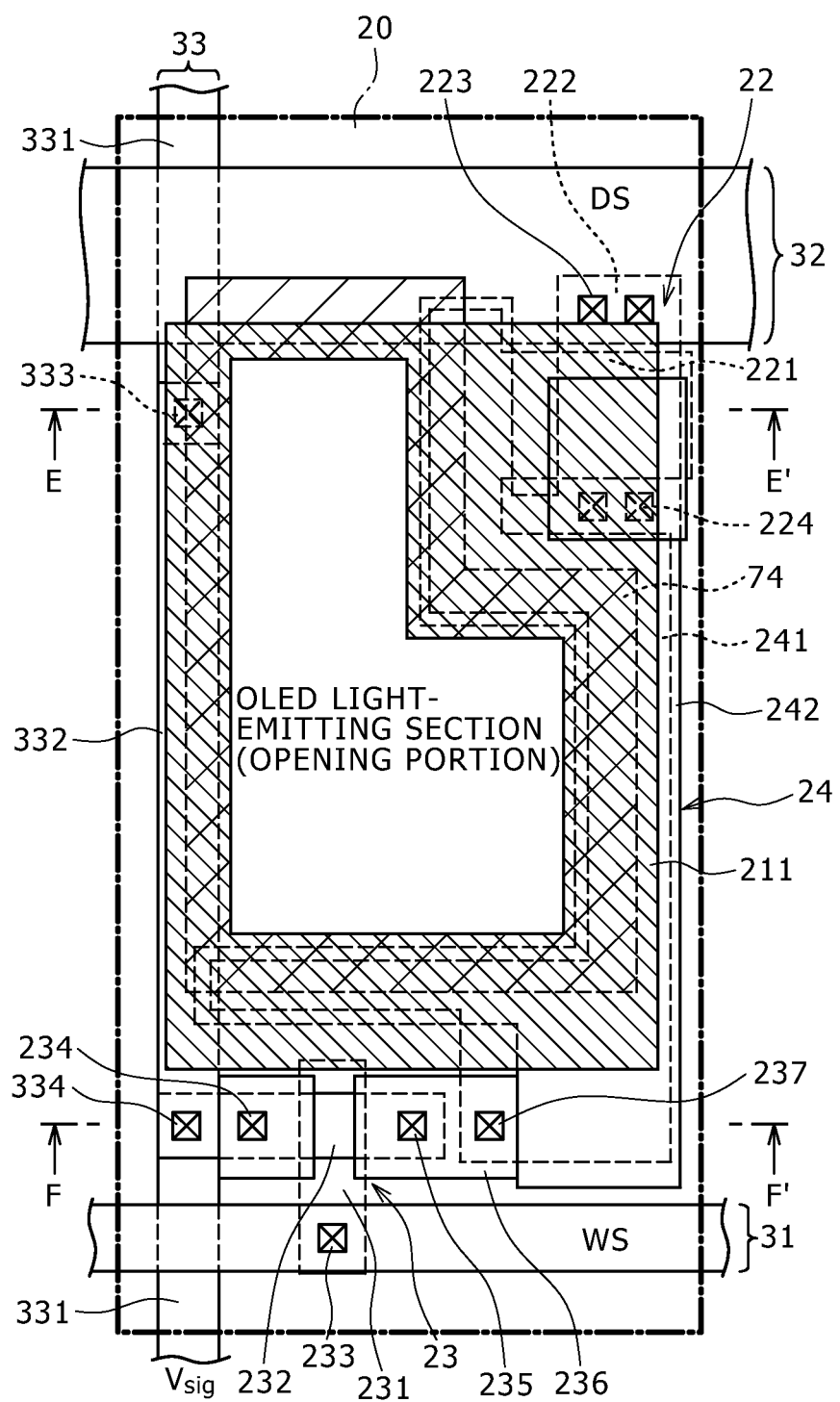
FIG. 14 is a schematic plan view illustrating the pixel structure of the organic EL display according to a second embodiment of the present disclosure.
Figure 15:
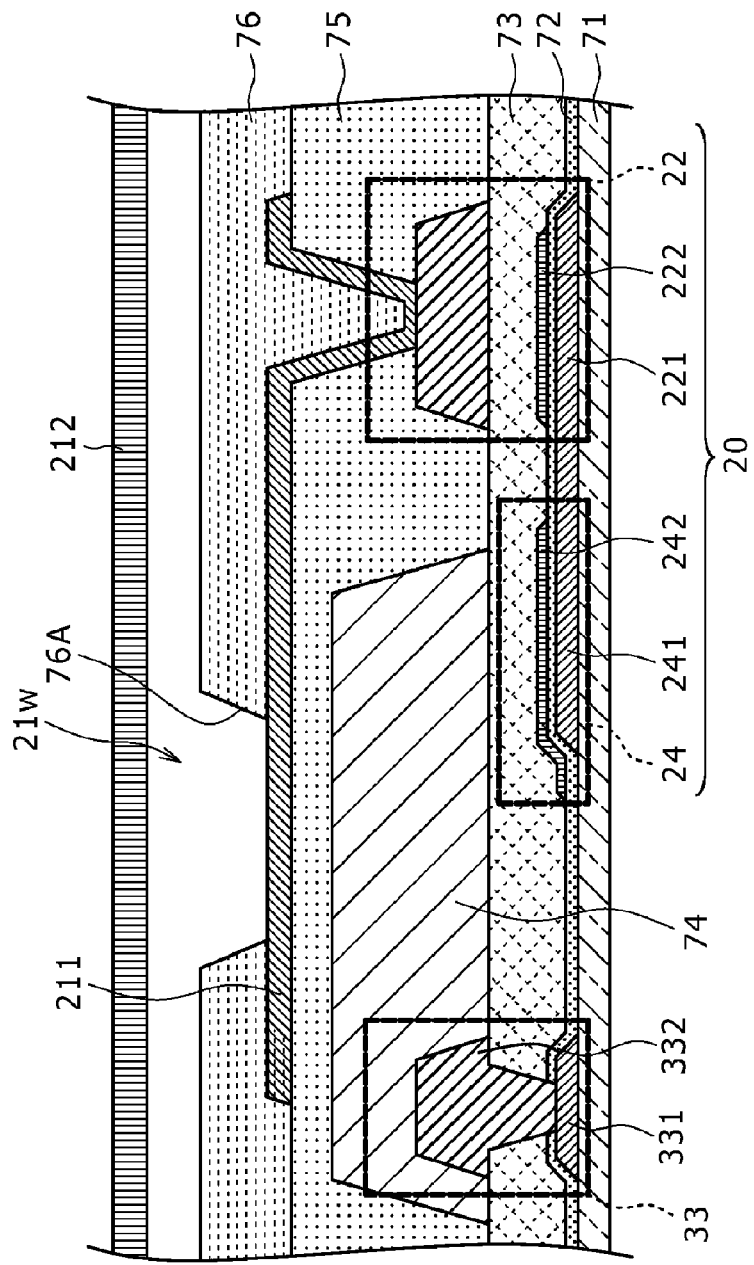
FIG. 15 is a sectional view taken along line of sight E-E' indicated by the arrows in FIG. 14.
Figure 16:
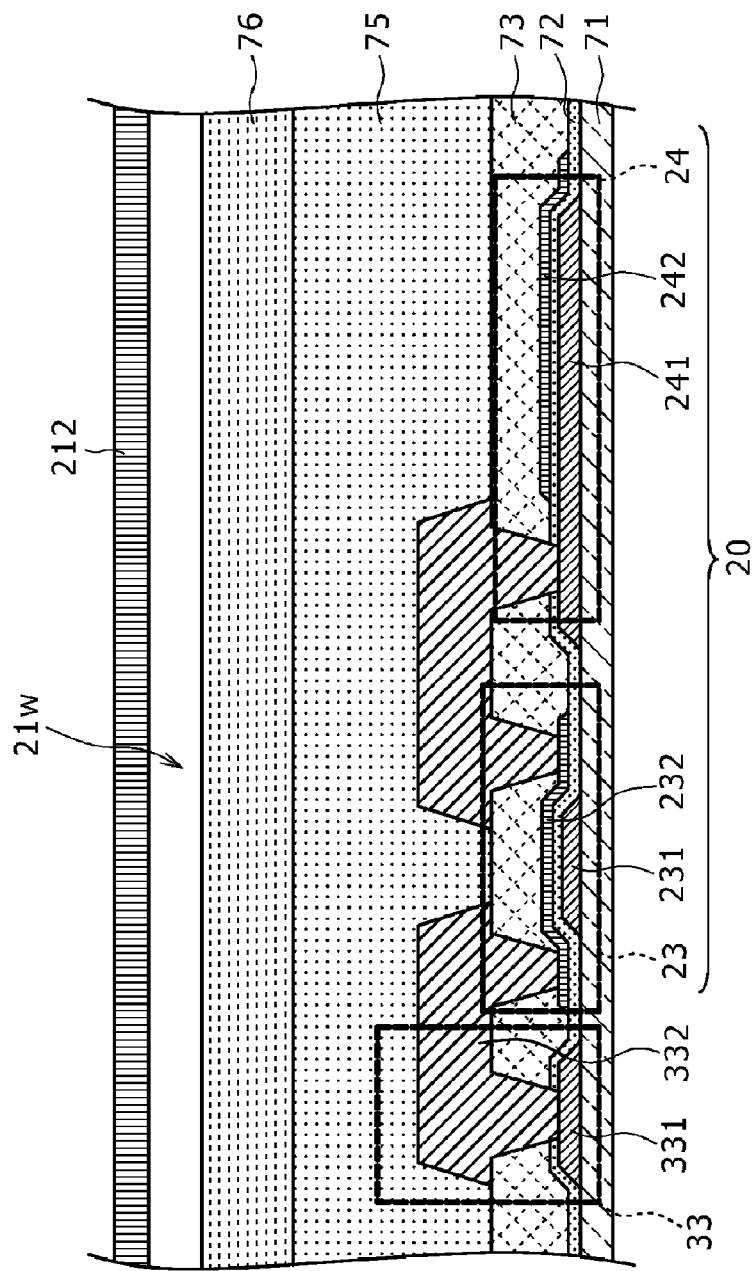
FIG. 16 is a sectional view taken along line of sight F-F' indicated by the arrows in FIG. 14.

FIG. 14 is a schematic plan view illustrating the pixel structure of the organic EL display according to the second embodiment. FIG. 15 is a sectional view taken along line of sight E-E' indicated by the arrows in FIG. 14. FIG. 16 is a sectional view taken along line of sight F-F' indicated by the arrows in FIG. 14. In FIGS. 14 to 16, like components to those shown in FIGS. 7 to 9 are denoted by the same reference numerals.

The organic EL display according to the second embodiment has a bottom emission structure (scheme) for extraction of light emitted by the organic EL elements and uses the white organic EL elements $21_W$ and color filter 74 in combination as does the counterpart according to the first embodiment.

As is clear particularly from FIG. 7, the organic EL display according to the first embodiment has the color filter 74 arranged in the region including where the drive transistor 22 and write transistor 23 are formed. In contrast, the organic EL display according to the second embodiment has the color filter 74 arranged in the region at least other than (avoiding) the channel regions of the transistors making up the drive circuit of the white organic EL element $21_W$ which are the drive transistor 22 and write transistor 23 in the present example.

More specifically, the drive transistor 22 is arranged (formed) closer to the right edge of the pixel 20 in FIG. 14 first. Then, the portion of the color filter 74 close to the power supply line 32 is formed in such a manner as to avoid at least the channel region of the drive transistor 22, and preferably the region where the drive transistor 22 is formed. Further, the portion of the color filter 74 close to the scan line 31 is formed in such a manner as to avoid at least the channel region of the write transistor 23, and preferably the region where the write transistor 23 is formed.

This ensures that the color filter 74, located between the light-emitting section of the white organic EL element $21_W$ and the layer where the drive circuit is formed, is not laid out on or above the drive transistor 22 or write transistor 23 as is clear particularly from FIGS. 15 and 16. Therefore, even if the material of the color filter 74 is charged by light emitted from the own pixel, the channels of the drive transistor 22 and write transistor 23 remain unaffected by the charging. As a result, the transistor characteristics do not change (shift).

The organic EL display according to the second embodiment has the same configuration as the counterpart according to the first embodiment. That is, the metal interconnects such as the signal line 33, power supply line 32, gate electrode 221 of the drive transistor 22, electrode 241 of the holding capacitor 24 and gate electrode 231 of the write transistor 23 are formed in such a manner as to surround the light-emitting section of the white organic EL element $21_W$ and the color filter 74.

The organic EL display according to the second embodiment described above provides the following action and effect in addition to the same action and effect as provided by the counterpart according to the first embodiment. That is, the color filter 74 is arranged in such a manner as to avoid at least the channel regions of the transistors making up the drive circuit of the white organic EL element $21_W$. This ensures that even if the material of the color filter 74 is charged by light emitted from the own pixel, the channels of the transistors remain unaffected by the charging.

In the case of the present configuration example using the pixel circuit shown in FIG. 2, the drive transistor 22 and write transistor 23 serve as the transistors making up the drive circuit of the white organic EL element $21_W$. However, the pixel circuit is not limited to that configured as shown in FIG. 2. Among other pixel circuits, a pixel circuit including a control transistor connected in series to the drive transistor 22 and adapted to control the white organic EL element $21_W$ to emit light or stop emitting light is known. In the case of this pixel circuit, the control transistor is included among the transistors making up the drive circuit.

Then, the fact that the color filter 74 is arranged in such a manner as to avoid the channel regions of the drive transistor 22 and write transistor 23 ensures that even if the material of the color filter 74 is charged by light emitted from the own pixel, the channels of the transistors remain unaffected by the charging. If the color filter 74 is laid out in such a manner as to avoid not only the channel regions of the drive transistor 22 and write transistor 23 but also the entire region where these transistors are formed, it is possible to positively ensure that the channels of the transistors 22 and 23 remain unaffected by the charging of the color filter 74.

If the channels of the drive transistor 22 and write transistor 23 remain unaffected by the charging of the color filter 74, a change (shift) in the characteristic of the drive transistor 22 or write transistor 23 does not take place. Therefore, the charge does not leak from the holding capacitor 24 during the light emission period, thus keeping brightness degradation to a minimum. Further, the threshold voltage $V_{th}$ of the drive transistor 22 does not shift during light emission, thus keeping uneven brightness from occurring and thereby providing a high quality display image.

4. Electronic Equipment

The organic EL display according to the present disclosure described above is applicable to the display section (display) of electronic equipment across all disciplines adapted to display a video signal fed thereto or generated therein. For example, the organic EL display according to the present disclosure is applicable to the display section of a variety of electronic equipment including a digital camera, laptop personal computer, personal digital assistant such as mobile phone and video camcorder shown in FIGS. 17 to 21G.

Using the organic EL display according to the present disclosure as the display section of a variety of electronic equipment contributes to improved display quality of these pieces of electronic equipment. That is, as is clear from the description of the embodiments, the organic EL display according to the first embodiment keeps the aggravation of color reproducibility caused by white light leaks and color shift to a minimum. On the other hand, the organic EL display according to the second embodiment keeps brightness degradation and uneven brightness to a minimum. As a result, using the organic EL displays according to the first and second embodiment contributes to an excellent image with high quality.

The organic EL display according to the present disclosure includes a display in a modular form having a sealed configuration. As an example, a display module formed by attaching an opposed section made, for example, of glass to the pixel array section corresponds to such a display. It should be noted that a circuit section adapted to exchange signals and other information between external equipment and the pixel array section, an FPC (flexible printed circuit) or other sections may be provided on the display module.

A description will be given below of specific examples of electronic equipment to which the present disclosure is applied.

Figure 17:
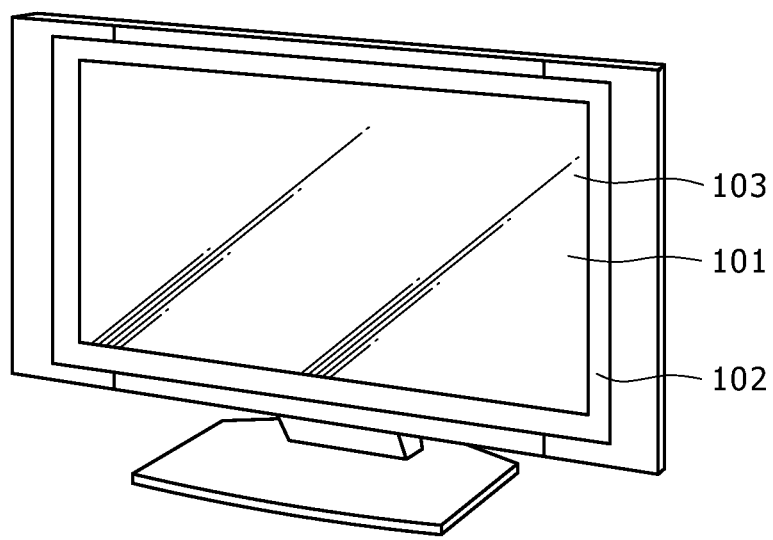
FIG. 17 is a perspective view illustrating the appearance of a television set to which the present disclosure is applied.

FIG. 17 is a perspective view illustrating a television set to which the present disclosure is applied. The television set according to the present application example includes a video display screen section 101 made up of a front panel 102, filter glass 103 and other parts. The television set is manufactured by using the organic EL display according to the present disclosure as the video display screen section 101.

Figure 18A:
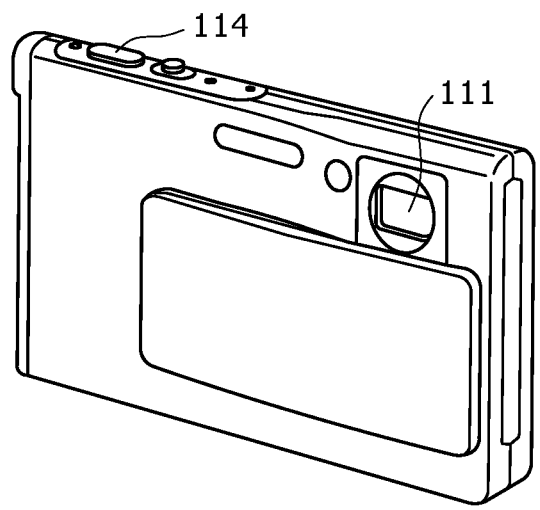
FIGS. 18A and 18B are perspective views illustrating the appearance of a digital camera to which the present disclosure is applied.
Figure 18B:
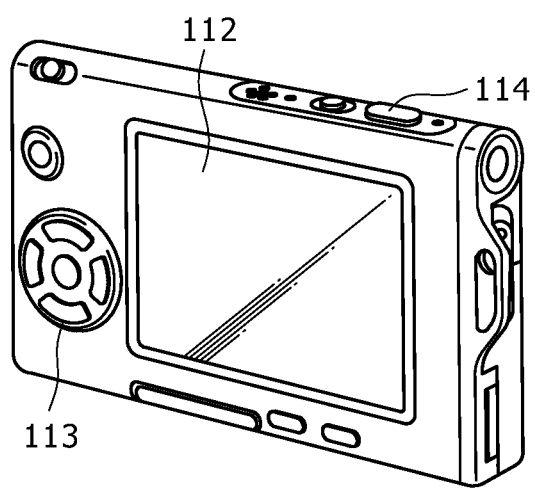

FIGS. 18A and 18B are perspective views illustrating a digital camera to which the present disclosure is applied. FIG. 18A is a front perspective view, and FIG. 18B a rear perspective view. The digital camera according to the present application example includes a flash-emitting section 111, display section 112, menu switch 113, shutter button 114 and other parts. The digital camera is manufactured by using the display according to the present disclosure as the display section 112.

Figure 19:
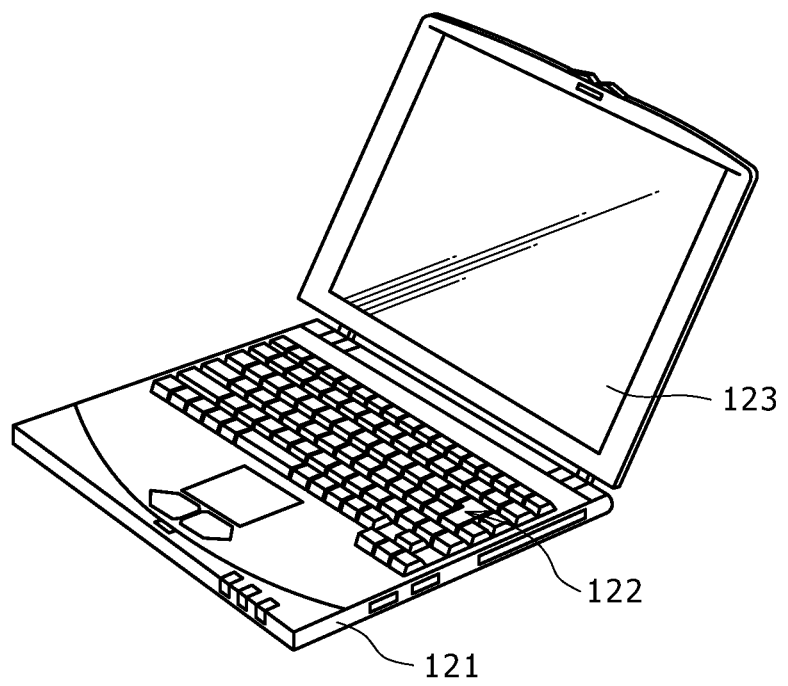
FIG. 19 is a perspective view illustrating the appearance of a laptop personal computer to which the present disclosure is applied.

FIG. 19 is a perspective view illustrating a laptop personal computer to which the present disclosure is applied. The laptop personal computer according to the present application example includes a keyboard 122 adapted to be manipulated for entry of text or other information, a display section 123 adapted to display an image and other parts in a main body 121. The laptop personal computer is manufactured by using the display according to the disclosure as the display section 123.

Figure 20:
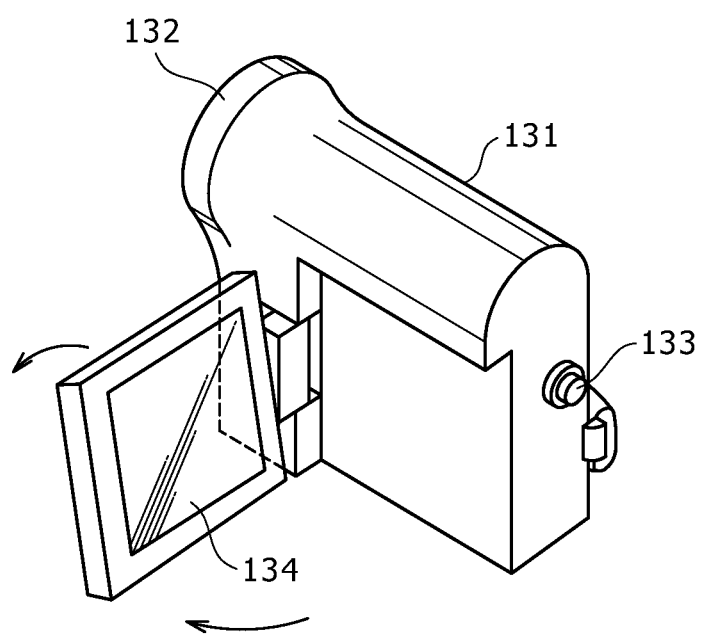
FIG. 20 is a perspective view illustrating the appearance of a video camcorder to which the present disclosure is applied.
Figure 22:
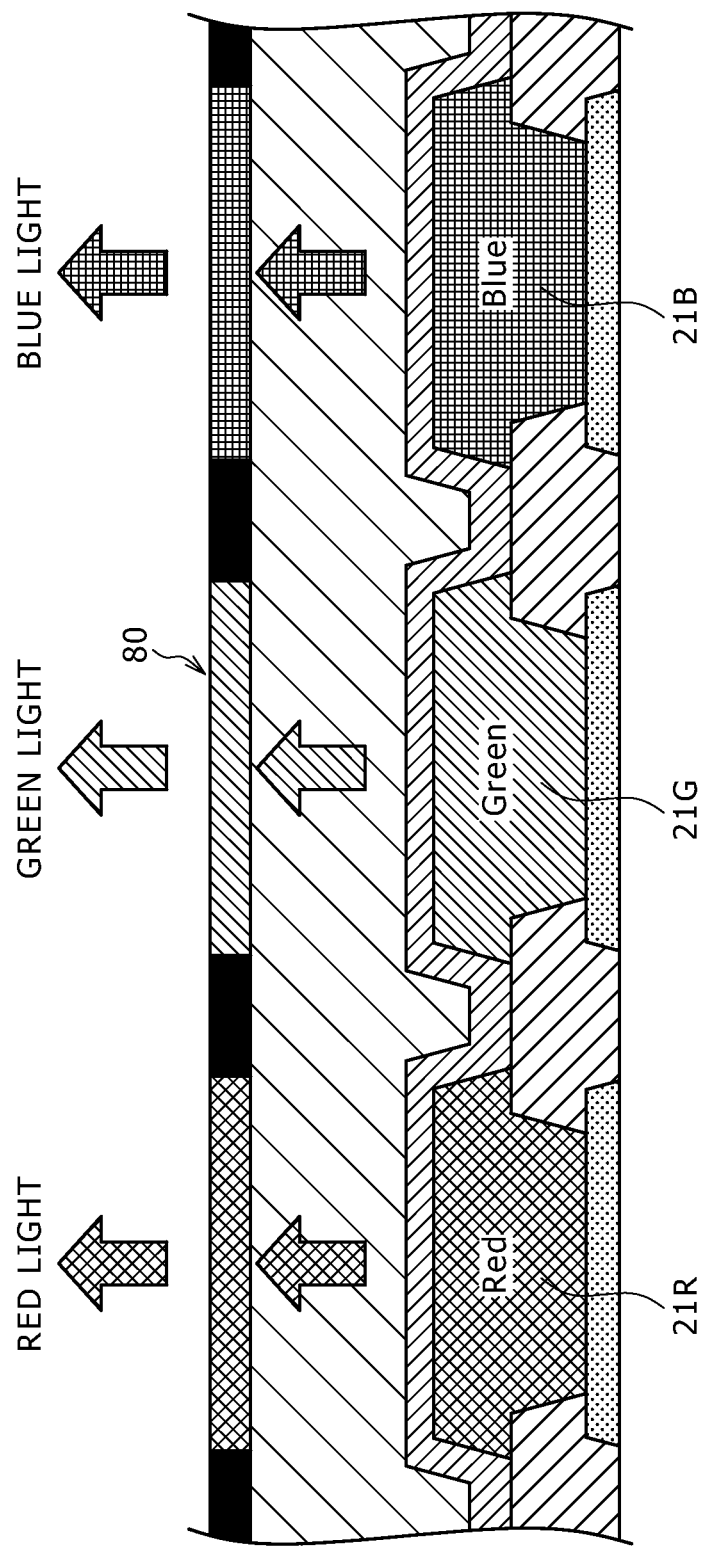
FIG. 22 is a sectional view illustrating the pixel structure when side-by-side patterning of RGB subpixels is used.
Figure 23:
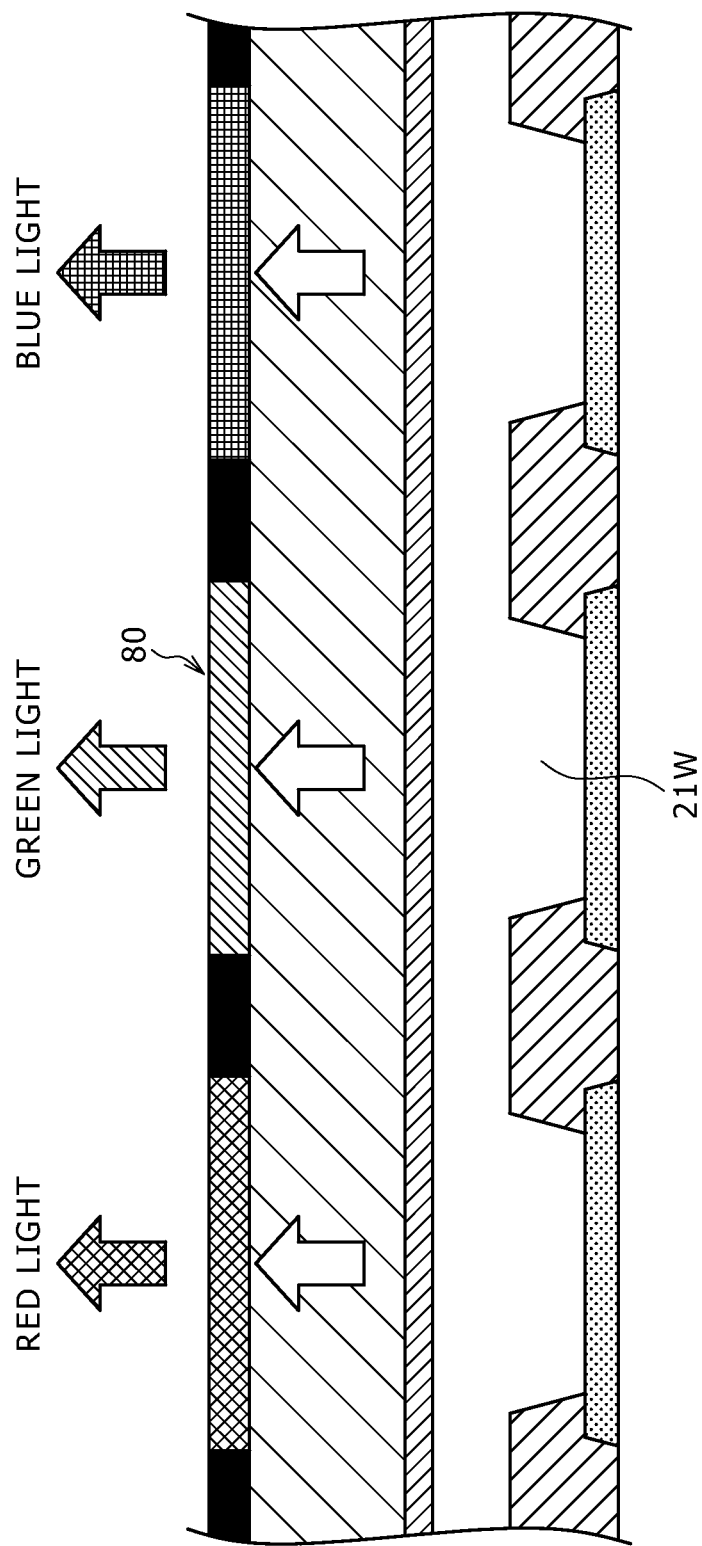
FIG. 23 is a sectional view illustrating the pixel structure when a white organic EL element and color filter are used in combination.
Figure 24:
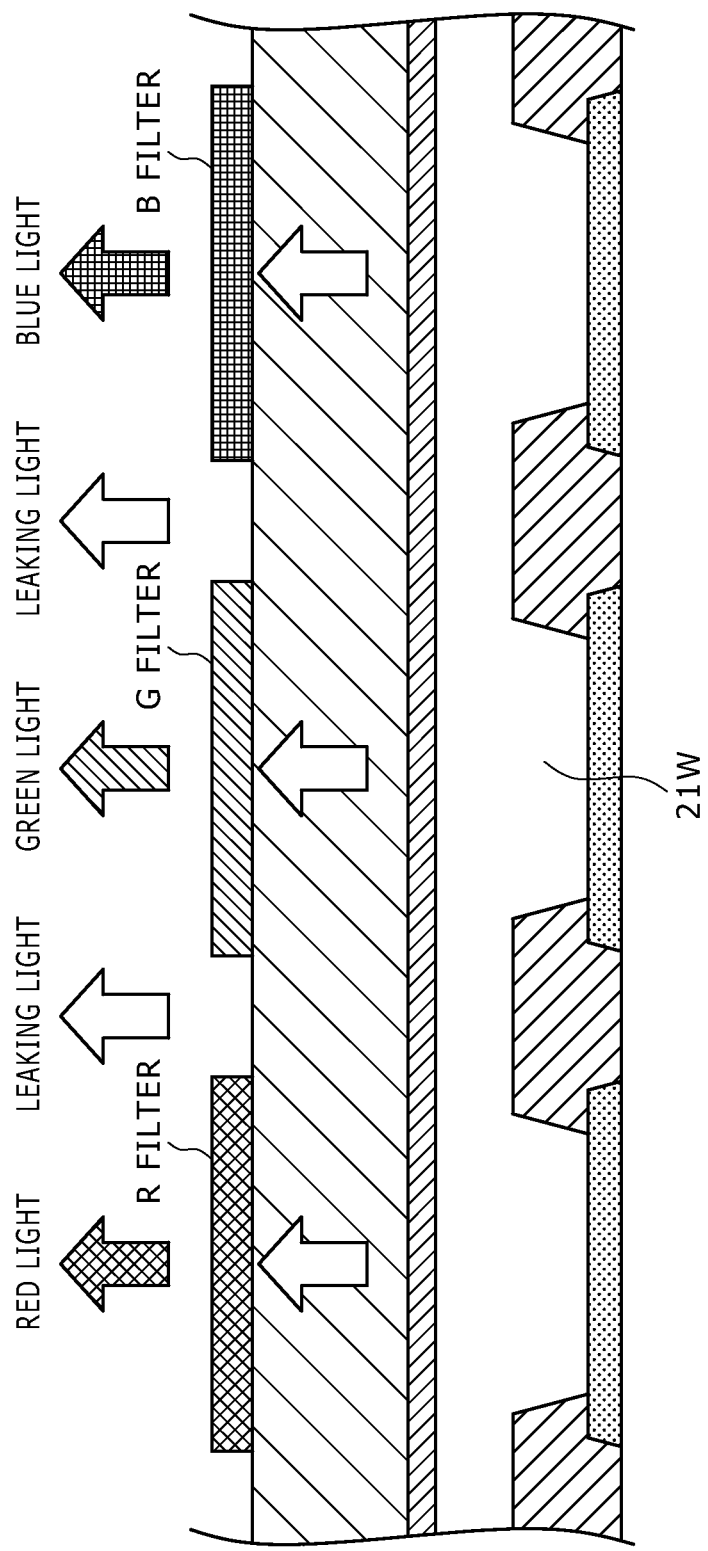
FIG. 24 is an explanatory diagram of white light leak caused by the absence of a light-shielding layer.
Figure 25:
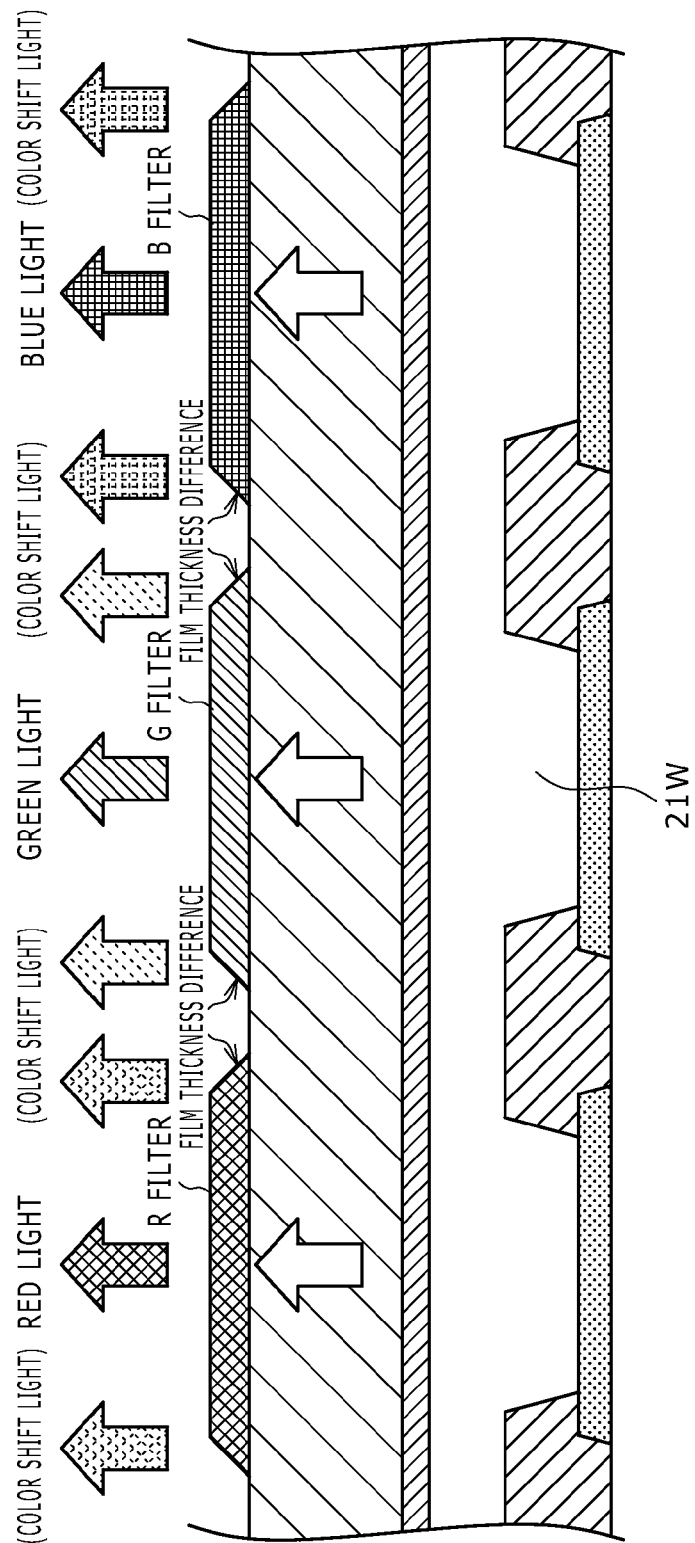
FIG. 25 is an explanatory diagram of color shift caused by the difference in thickness at the edge of the color filter.

FIG. 20 is a perspective view illustrating a video camcorder to which the present disclosure is applied. The video camcorder according to the present application example includes a main body section 131, lens 132 provided on the front-facing side surface to capture the image of the subject, imaging start/stop switch 133, display section 134 and other parts. The video camcorder is manufactured by using the organic EL display according to the present disclosure as the display section 134.

FIGS. 21A to 21G are appearance views of a personal digital assistance such as mobile phone to which the present disclosure is applied. FIG. 21A is a front view in an open position, FIG. 21B a side view thereof, FIG. 21C a front view in a closed position, FIG. 21D a left side view, FIG. 21E a right side view, FIG. 21F a top view, and FIG. 21G a bottom view. The mobile phone according to the present application example includes an upper enclosure 141, lower enclosure 142, connecting section (hinge section in this example) 143, display 144, subdisplay 145, picture light 146, camera 147 and other parts. The mobile phone according to the present application example is manufactured by using the organic EL display according to the present disclosure as the display 144 and subdisplay 145.

The present technology contains subject matter related to that disclosed in Japanese Priority Patent Application JP 2011-022351 filed in the Japan Patent Office on Feb. 4, 2011, the entire content of which is hereby incorporated by reference.

While a preferred embodiment of the disclosed technique has been described using specific terms, such description is for illustrative purposes only, and it is to be understood that changes and variations may be made without departing from the spirit or scope of the following claims.

What is claimed is:

1. An organic electroluminescence display comprising:
   a window insulating film between a cathode electrode and a layer of metal interconnects, an opening portion extending through said window insulating film;
   an anode electrode between a color filter and said opening portion, said anode electrode touching said window insulating film and one of the metal interconnects;
   an organic electroluminescence element within said opening portion, said organic electroluminescence element being between said cathode electrode and said anode electrode:
   wherein said one of the metal interconnects is in said color filter,
   wherein said opening portion is a trench in said window insulating film.

2. The organic electroluminescence display of claim 1, wherein said organic electroluminescence element touches said cathode electrode and said anode electrode.

3. The organic electroluminescence display of claim 1, wherein said organic electroluminescence element touches said window insulating film.

4. The organic electroluminescence display of claim 1, wherein said opening portion terminates at said anode electrode.

5. The organic electroluminescence display of claim 1, wherein said organic electroluminescence element is configured to emit white light.

6. The organic electroluminescence display of claim 5, wherein said color filter is configured to extract light of a different color from said white light.

7. The organic electroluminescence display of claim 6, wherein said color filter is between said anode electrode and a transparent substrate, said light of the different color being transmissible through said transparent substrate.

8. The organic electroluminescence display of claim 1, wherein said one of the metal interconnects overlaps a periphery of the color filter.

9. The organic electroluminescence display of claim 8, wherein said one of the metal interconnects overlaps said periphery of the color filter by as much as or more than a thickness of the color filter.

10. The organic electroluminescence display of claim 1, wherein said layer of the metal interconnects is in an insulating planarizing film.

11. The organic electroluminescence display of claim 10, wherein said insulating planarizing film is between said color filter and said window insulating film.

12. The organic electroluminescence display of claim 10, wherein said anode electrode is between said insulating planarizing film and said window insulating film.

13. The organic electroluminescence display of claim 10, wherein said color filter is in said insulating planarizing film.

14. The organic electroluminescence display of claim 10, further comprising:
   a drive transistor configured to provide electrical connection and disconnection between said anode electrode and a power supply line, said power supply being another of the metal interconnects.

15. The organic electroluminescence display of claim 14, wherein said insulating planarizing film is between said window insulating film and said layer of the metal interconnects.

16. The organic electroluminescence display of claim 15, wherein another portion of the anode electrode extends to a drive transistor one of the metal interconnects through said insulating planarizing film.

17. The organic electroluminescence display of claim 14, further comprising:
   a write transistor configured to provide electrical connection and disconnection between a gate electrode of the drive transistor and a signal line of the metal interconnects.

18. The organic electroluminescence display of claim 17, wherein said signal line of the metal interconnects extends through an interlayer insulating film.

19. The organic electroluminescence display of claim 18, wherein said interlayer insulating film is between said drive transistor and said layer of the metal interconnects.

20. The organic electroluminescence display of claim 18, further comprising:
   a terminal of a holding capacitor electrically connected to said gate electrode of the drive transistor, said anode electrode being electrically connected to another terminal of the holding capacitor.

21. The organic electroluminescence display of claim 20, wherein said gate electrode of the drive transistor is said terminal of the holding capacitor.

22. The organic electroluminescence display of claim 20, wherein said interlayer insulating film is between said layer of the metal interconnects and said holding capacitor.

23. Electronic equipment comprising:
   the organic electroluminescence display of claim 1;

an enclosure supporting said organic electroluminescence display.

* * * * *